United States Patent
Maeda et al.

(10) Patent No.: US 8,174,890 B2
(45) Date of Patent: May 8, 2012

(54) NON-VOLATILE SEMICONDUCTOR STORAGE DEVICE

(75) Inventors: Takashi Maeda, Yokohama (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 12/721,001

(22) Filed: Mar. 10, 2010

(65) Prior Publication Data

US 2010/0232224 A1  Sep. 16, 2010

(30) Foreign Application Priority Data

Mar. 11, 2009 (JP) ................................. 2009-058538

(51) Int. Cl.
*G11C 11/34* (2006.01)
*G11C 16/04* (2006.01)
(52) U.S. Cl. .......................... 365/185.17; 365/185.18
(58) Field of Classification Search ............. 365/185.17, 365/185.18, 185.05
See application file for complete search history.

(56) References Cited

U.S. PATENT DOCUMENTS

| | | | | |
|---|---|---|---|---|
| 4,939,690 | A * | 7/1990 | Momodomi et al. | 365/185.17 |
| 5,946,229 | A * | 8/1999 | Kobatake et al. | 365/182 |
| 7,847,324 | B2 * | 12/2010 | Kasahara | 257/288 |
| 8,030,700 | B2 * | 10/2011 | Sakamoto | 257/324 |
| 2007/0252201 | A1 | 11/2007 | Kito et al. | |

FOREIGN PATENT DOCUMENTS

| | | |
|---|---|---|
| JP | 2007-266143 | 10/2007 |
| WO | WO 2009/075370 A1 | 6/2009 |

OTHER PUBLICATIONS

H. Tanaka et al., "Bit Cost Scalable Technology with Punch and Plug Process for Ultra High Density Flash Memory", Symposium on VLSI Tehcnology Digest of Technical Papers, 2007, pp. 14-15.
Yoshiaki Fukuzumi et al., "Optimal Integration and Characteristics of Vertical Array Devices for Ultra-High Density, Bit-Cost Scalable Flash Memory", IEDM Technology Digest. 2007, 4 pages.
U.S. Appl. No. 12/679,991, filed Mar. 25, 2010, Fukuzumi, et al.

* cited by examiner

*Primary Examiner* — Anh Phung
(74) *Attorney, Agent, or Firm* — Oblon, Spivak, McClelland, Maier & Neustadt, L.L.P.

(57) ABSTRACT

A memory cell array has plural memory strings arranged therein, each of which including a plurality of electrically-rewritable memory transistors and selection transistors. Each memory string includes a body semiconductor layer including four or more columnar portions, and a joining portion formed to join the lower ends thereof. An electric charge storage layer is formed to surround a side surface of the columnar portions. A first conductive layer is formed to surround a side surface of the columnar portions as well as the electric charge storage layer. A plurality of second conductive layers are formed on side surfaces of the joining portion via an insulation film, and function as control electrodes of a plurality of back-gate transistors formed at a respective one of the joining portions.

18 Claims, 21 Drawing Sheets

FIG. 21

|  | Read (BLside) | Read (SLside) | Program"0" (BLside) | Program"0" (SLside) | Program"1" (BLside) | Program"1" (SLside) | Erase |
|---|---|---|---|---|---|---|---|
| BLn | Vbl | Vbl | Vss | Vss | Vdd | Vdd | Vera |
| SGDm | Vdd/Vss | Vdd(all) | Vdd/Vss | Vdd(all) | Vdd/Vss | Vdd(all) | Verag |
| Selected WLm | Vss | Vss | Vpgm | Vpgm | Vpgm | Vpgm | Vss |
| Unselected WLm | Vread | Vread | Vpass | Vpass | Vpass | Vpass | floating |
| BG | Vread(all) | Vread(all) | Vpass/Vss | Vpass/Vss | Vpass/Vss | Vpass/Vss | floating |
| SGS | Vdd(all) | Vdd/Vss | Vss | Vss | Vss | Vss | Verag(all) |
| SLn | Vss | Vss | Vdd | Vdd | Vdd | Vdd | Vera |

NON-VOLATILE SEMICONDUCTOR STORAGE DEVICE

CROSS REFERENCE TO RELATED APPLICATIONS

This application is based on and claims the benefit of priority from prior Japanese Patent Application No. 2009-58538, filed on Mar. 11, 2009, the entire contents of which are incorporated herein by reference.

BACKGROUND OF THE INVENTION

1. Field of the Invention

The present invention relates to an electrically rewritable non-volatile semiconductor storage device.

2. Description of the Related Art

Conventionally, LSIs are formed by integration of devices in a two-dimensional plane on a silicon substrate. Although a typical way of increasing memory capacity is to reduce (miniaturizing) a dimension of an element, recent years are facing challenges in such miniaturization from the viewpoint of cost and technology. Such miniaturization requires further improvements in photolithography technology. However, the costs of lithography process are ever increasing. In addition, even if such miniaturization is accomplished, it is expected that physical characteristic of an element such as a breakdown voltage between elements, would reach a limit unless a driving voltage of the element can be scaled. That is, it is likely that difficulties would be encountered in device operation itself.

Therefore, semiconductor storage devices have been proposed recently where memory cells are arranged in a three-dimensional manner to achieve improved integration of memory devices (see, Patent Document 1: Japanese Patent Laid-Open No. 2007-266143).

One of the conventional semiconductor storage devices where memory cells are arranged in a three-dimensional manner uses transistors with a cylinder-type structure. Those semiconductor storage devices using transistors with the cylinder-type structure are provided with multiple conductive layers corresponding to gate electrodes and pillar-like columnar semiconductors. Each columnar semiconductor layer serves as a channel (body) part of a respective transistor. Memory gate insulation layers are provided around the columnar semiconductor layers. Such a configuration including these conductive layers, a columnar semiconductor layer, and a memory gate insulation layer is referred to as a "memory string".

In these semiconductor storage devices with three-dimensional structures, to achieve improved integration, it is desirable to increase the number of memory cells formed in each memory string (or, the number of memory cells laminated) as much as possible. However, there is a problem that a read operation becomes more difficult due to the reduction in reading current as one memory string includes more memory cells and columnar semiconductors becomes longer.

SUMMARY OF THE INVENTION

One aspect of the present invention provides a non-volatile semiconductor storage device comprising: a memory cell array including a plurality of memory strings arranged therein, each of the memory strings including a plurality of electrically rewritable memory transistors and selection transistors operative to select the memory transistors; and a control unit configured to control voltage supplied to respective control electrodes of the memory transistors and the selection transistors, each of the memory strings comprising: a body semiconductor layer including four or more columnar portions extending in a vertical direction to a substrate, and a joining portion formed to join the lower ends of the columnar portions; an electric charge storage layer formed to surround a side surface of a respective one of the columnar portions; a first conductive layer formed to surround a side surface of a respective one of the columnar portions as well as the electric charge storage layer, and functioning as a control electrode of a respective one of the memory transistors; and a plurality of second conductive layers formed on side surfaces of the joining portion via an insulation film, and functioning as control electrodes of a plurality of back-gate transistors formed at a respective one of the joining portions.

BRIEF DESCRIPTION OF THE DRAWINGS

FIG. 21 is a table illustrating the voltages applied to the different components during the operations of the non-volatile semiconductor storage device according to the first embodiment;

DETAILED DESCRIPTION OF THE EMBODIMENTS

Embodiments of the present invention will now be described in detail below with reference to the accompanying drawings.

The following description will be made on a non-volatile semiconductor storage device according to the embodiments of the present invention with reference to the drawings.

First Embodiment (Configuration of Non-Volatile Semiconductor Storage Device 100 in First Embodiment)

Figure 1:
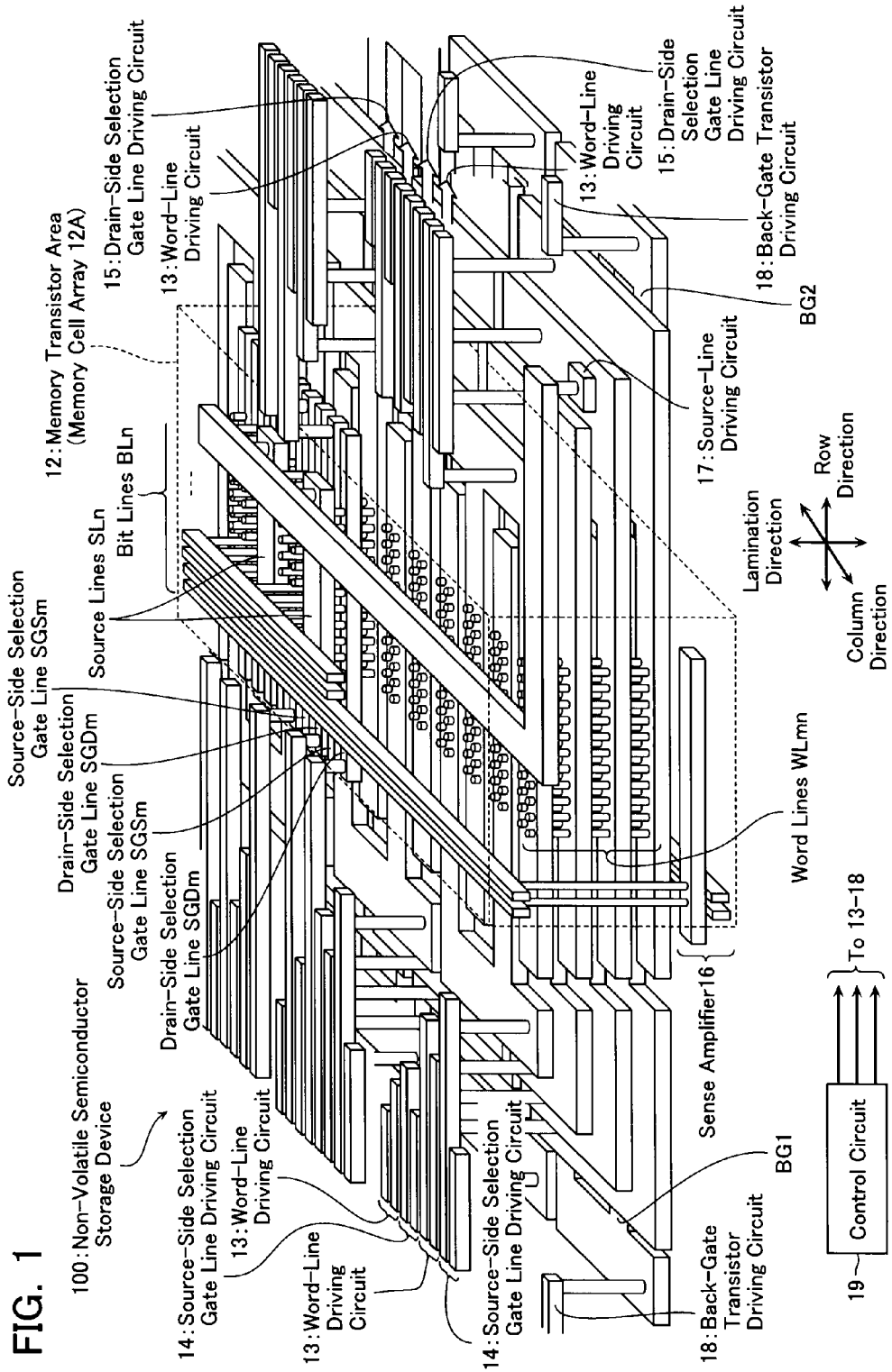
FIG. 1 is a schematic diagram illustrating a configuration of a non-volatile semiconductor storage device 100 according to a first embodiment of the present invention.

FIG. 1 is a schematic diagram of a non-volatile semiconductor storage device 100 according to a first embodiment of the present invention. As illustrated in FIG. 1, the non-volatile semiconductor storage device 100 according to the first embodiment comprises a memory transistor area 12. Although specific illustration omitted, the non-volatile semiconductor storage device 100 also comprises word-line driving circuits 13, source-side selection-gate-line ($SGS_m$) driving circuits 14, drain-side selection-gate-line ($SGD_m$) driving circuits 15, a sense amplifier 16, a source-line driving circuit 17, and back-gate-transistor driving circuits 18. In addition, a control circuit 19 is provided for controlling the driving circuits 13 to 15, 17 and 18, as well as the sense amplifier 16.

The memory transistor area 12 has a memory cell array 12A in which memory transistors for storing data are arranged in a three-dimensional manner. The word-line driving circuits 13 control voltage applied to word lines $WL_m$. The source-side selection-gate-line ($SGS_m$) driving circuits 14 control voltage applied to source-side selection gate lines $SGS_m$. The drain-side selection-gate-line ($SGD_m$) driving circuits 15 control voltage applied to drain-side selection gate lines ($SGD_m$). The sense amplifier 16 amplifies the potential read from a memory transistor. The source-line driving circuit 17 controls voltage applied to a source line $SL_n$. The back-gate-transistor driving circuits 18 control voltage applied to back-gate lines BG1 and BG2, individually. In addition to this, the non-volatile semiconductor storage device 100 in the first embodiment comprises bit-line driving circuits (not illustrated) that control voltage applied to a bit line $BL_n$.

Figure 2A:
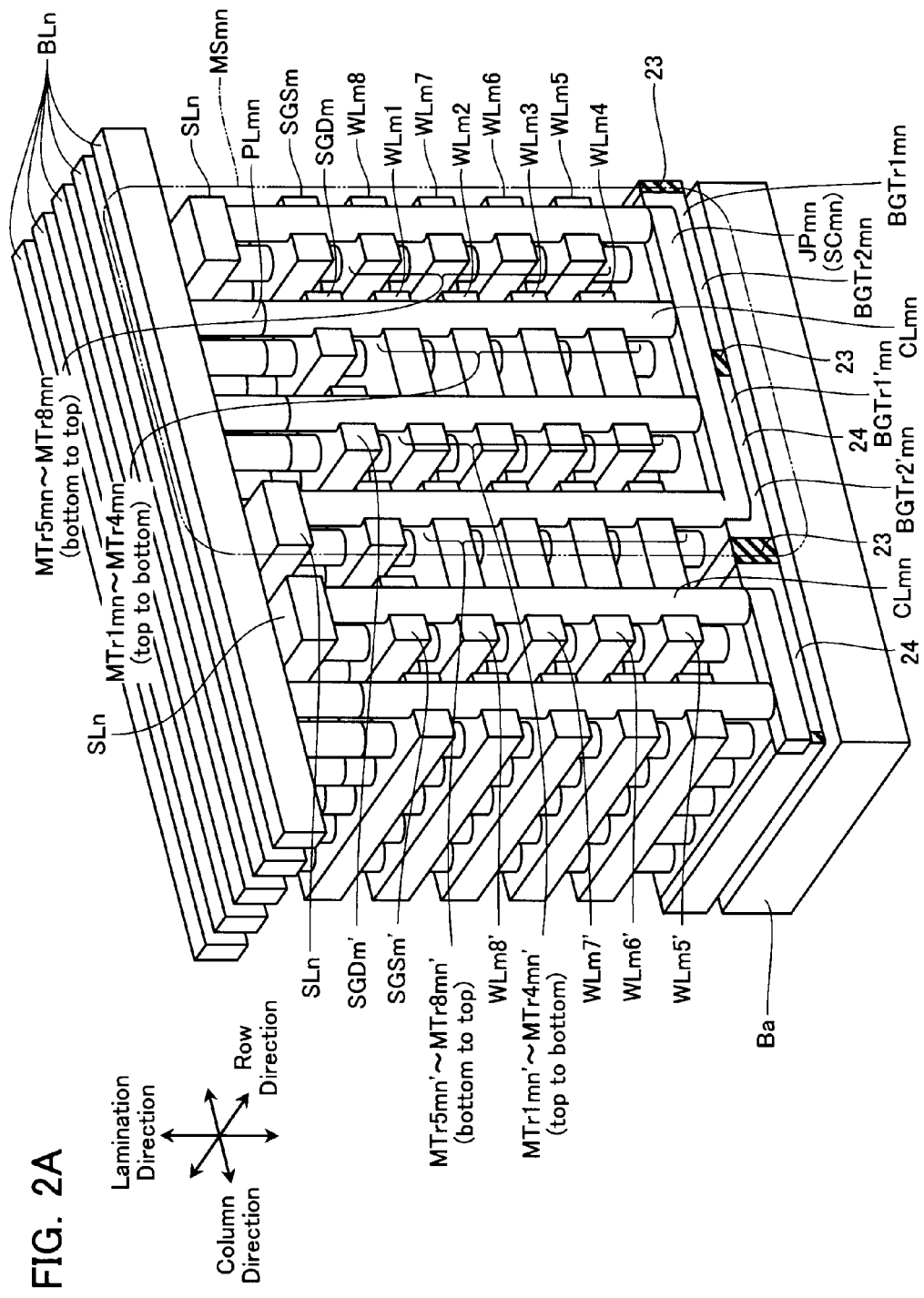
FIG. 2A is a schematic perspective view illustrating a part of a memory transistor area 12 according to the first embodiment of the present invention.
Figure 2B:
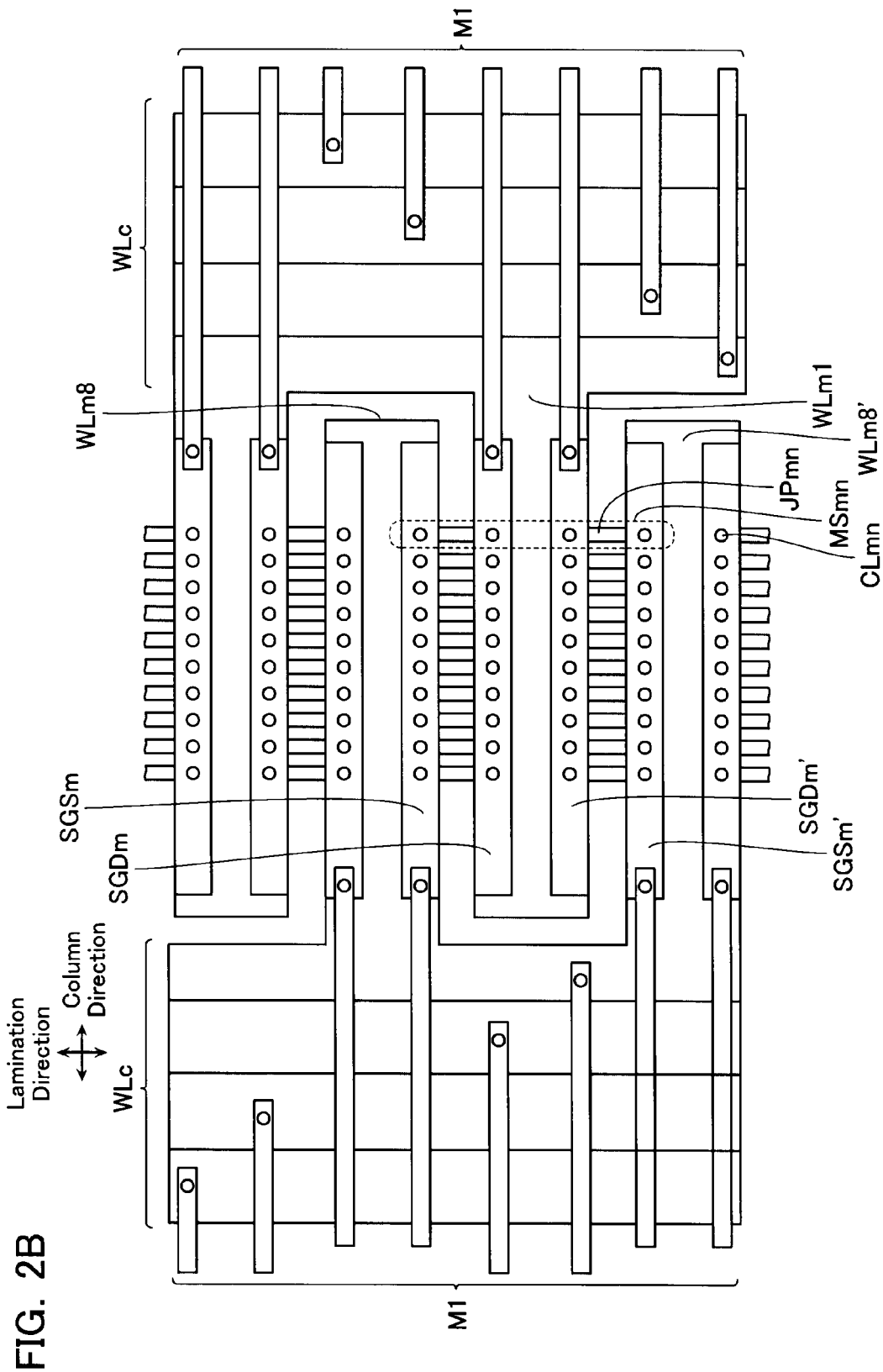
FIG. 2B is a plan view of the memory transistor area 12 and its peripheral area according to the first embodiment of the present invention (some parts omitted for clarity)
Figure 3:
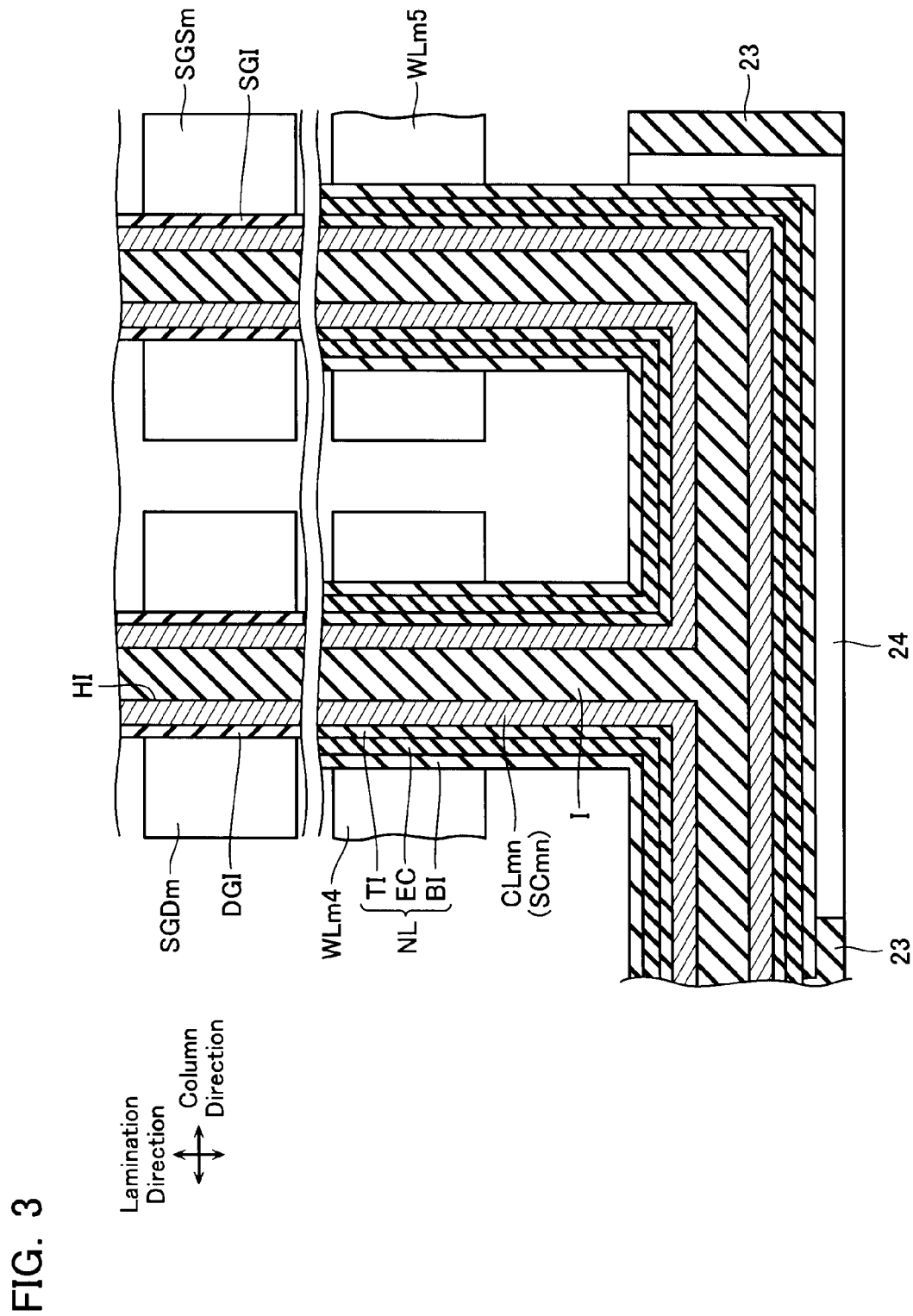
FIG. 3 is an enlarged view of one memory string MS according to the first embodiment of the present invention.
Figure 4:
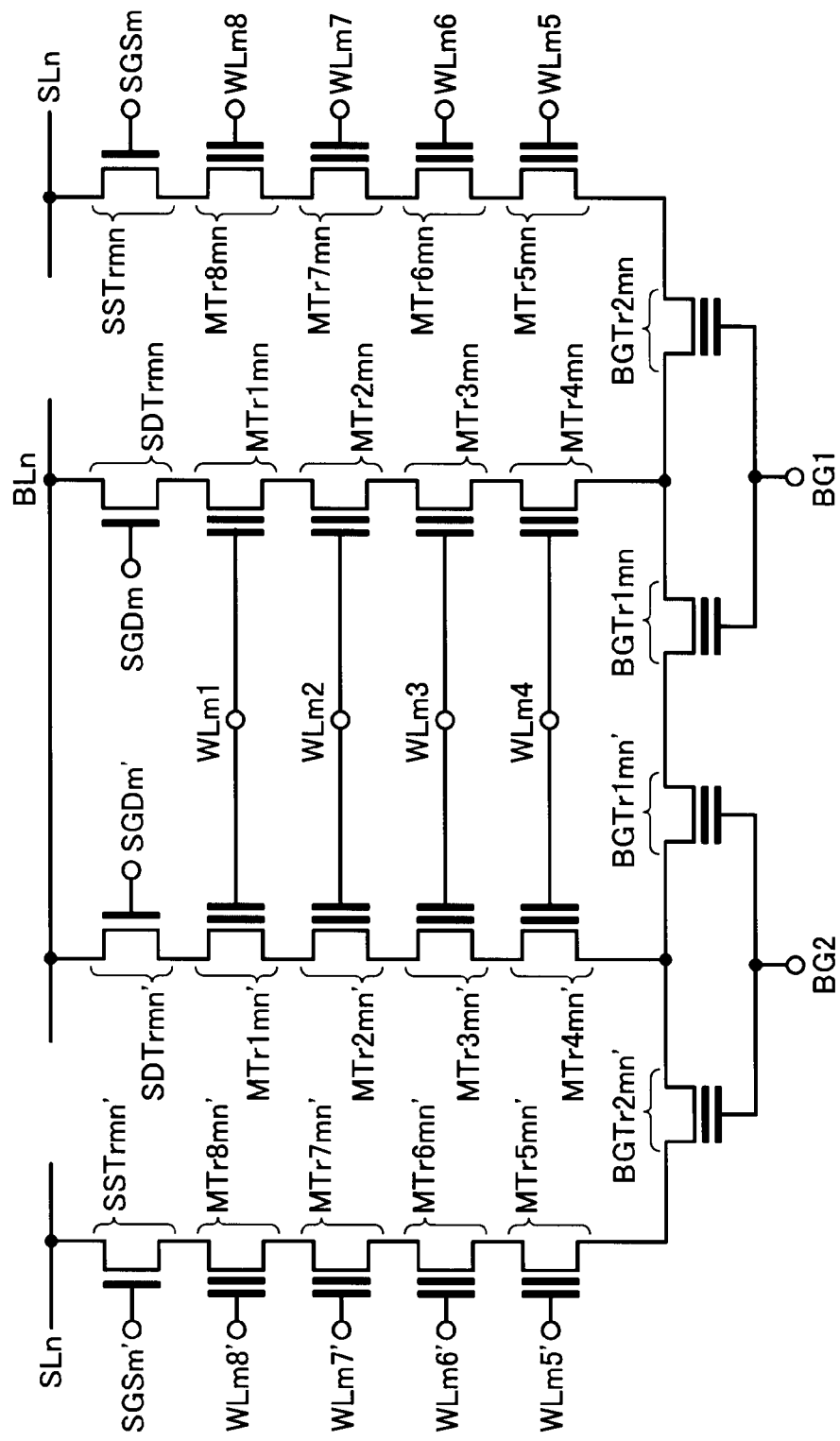
FIG. 4 is an equivalent circuit diagram of one memory string MS according to the first embodiment of the present invention.

FIG. 2A is a schematic perspective view illustrating a part of a memory transistor area 12 in the non-volatile semiconductor storage device 100 according to the first embodiment. In addition, FIG. 2B is a plan view of the memory transistor area 12 and its peripheral area in the non-volatile semiconductor device 100 (some parts omitted for clarity). FIG. 3 is an enlarged cross-sectional view of a part of one memory string MS, which represents a unit of memory transistors. FIG. 4 is an equivalent circuit diagram of one of the memory strings $MS_{mn}$ formed in the memory transistor area 12.

As illustrated in FIGS. 2A and 2B, the memory transistor area 12 includes m×n memory strings $MS_{mn}$ (where m and n are natural numbers) arranged in a matrix form in the planar direction, which form the memory cell array 12A. As illustrated in FIG. 4, formed in each memory string $MS_{mn}$ are sixteen electrically rewritable memory transistors ($MTr1_{mn}$ to $MTr8_{mn}$ and $MTr1_{mn}'$ to $MTr8_{mn}'$), source-side selection transistors $SSTr_{mn}$, $SSTr_{mn}'$, drain-side selection transistors $SDTr_{mn}$, $SDTr_{mn}'$, and back-gate transistors $BGTr1_{mn}$, $BGTr2_{mn}$, $BGTr1_{mn}'$, $BGTr2_{mn}'$. Hereinafter, these transistors may be collectively referred to as "memory transistors MTr", "source-side selection transistors SSTr", "drain-side selection transistors SDTr", and "back-gate transistors BGTr", respectively.

Each memory string $MS_{mn}$ has a plurality of (in this case four) columnar portions $CL_{mn}$ that extend in a vertical direction to a semiconductor substrate Ba and that are aligned in the column direction, and a joining portion $JP_{mn}$ that extends to join the lower ends of the columnar portions $CL_{mn}$, with the column direction taken as its longitudinal direction. The columnar portions $CL_{mn}$ and the joining portion $JP_{mn}$ together form a body semiconductor layer $SC_{mn}$ as the channel region (body) of memory transistors and selection transistors. That is, in this embodiment, each memory string $MS_{mn}$ has a so-called "fork-like" shape. Each columnar portion $CL_{mn}$ has four memory transistors MTr formed therein so that they are connected in series to each other. Thus, in each memory string $MS_{mn}$, four memory transistors MTr are connected in series in each of four columnar portions $CL_{mn}$ that are connected in parallel to a joining portion $JP_{mn}$. Accordingly, each memory string $MS_{mn}$ has a total of sixteen (4×4=16) memory transistors MTr arranged therein (see FIG. 4).

In addition, four back-gate transistors $BGTr1_{mn}$, $BGTr2_{mn}$, $BGTr1_{mn}'$, $BGTr2_{mn}'$ are formed at each joining portion $JP_{mn}$ so that they are connected in series with one another (see FIG. 4). As illustrated in FIG. 2A, back-gate conductive layers 24 are formed under the joining portion $JP_{mn}$ via insulation films not illustrated in FIG. 2A. A plurality of back-gate conductive layers 24 are formed in conductive layers 22 in which joining portions $JP_{mn}$ are embedded, so that they are insulated and isolated from one another by trench insulation films 23.

The back-gate conductive layers 24 are provided in a stripe pattern, with the row direction taken as their longitudinal direction. These two back-gate conductive layers 24 and the joining portion $JP_{mn}$ together form four back-gate transistors $BGTr1_{mn}$, $BGTr2_{mn}$, $BGTr1_{mn}'$, $BGTr2_{mn}'$.

Specifically, the right one of two back-gate conductive layers 24 formed under one joining portion $JP_{mn}$ is formed below the right two columnar portions $CL_{mn}$ in one memory string $MS_{mn}$, providing the gate electrodes (control electrodes) of the back-gate transistors $BGTr1_{mn}$ and $BGTr2_{mn}$, as illustrated in FIG. 4. In addition, the left one of the back-gate conductive layers 24 is formed below the left two columnar portions $CL_{mn}$ in the memory string $MS_{mn}$, providing the gate electrodes (control electrodes) of the back-gate transistors $BGTr1_{mn}'$ and $BGTr2_{mn}'$, as illustrated in FIG. 4.

Note that the right and left back-gate conductive layers 24 are each provided with independent voltages. This allows the back-gate transistors $BGTr1_{mn}$ and $BGTr2_{mn}$ to be switched between conductive and non-conductive states, independently of $BGTr1_{mn}'$ and $BGTr2_{mn}'$.

In addition, word lines $WL_m$ are arranged to surround respective two columnar portions $CL_{mn}$ via an insulation film. The word lines $WL_m$ in respective layers have a shape extending in parallel to the row direction. The word lines $WL_m$ in respective layers are repeatedly formed in lines at a first interval in the column direction so that they are insulated and isolated from each other. Here, focusing on one memory string $MS_{mn}$, the middle two columnar portions $CL_{mn}$ share word lines $WL_m1$ to $WL_m4$ from top to bottom. The word lines $WL_m1$ to $WL_m4$ and the columnar portions $CL_{mn}$ together form the memory transistors $MTr1_{mn}$ to $MTr4_{mn}$ and $MTr1_{mn}'$ to $MTr4_{mn}'$, as illustrated in FIG. 4.

The rightmost columnar portion $CL_{mn}$ shares word lines $WL_m5$ to $WL_m8$ with another adjacent memory string MS (not illustrated). The rightmost columnar portion $CL_{mn}$ and the word lines $WL_m5$ to $WL_m8$ together form memory transistors $MTr5_{mn}$ to $MTr8_{mn}$.

Similarly, the leftmost columnar portion $CL_{mn}$ shares word lines $WL_m5'$ to $WL_m8'$ with still another adjacent memory string MS. The leftmost columnar portion $CL_{mn}$ and the word lines $WL_m5'$ to $WL_m8'$ together form memory transistors $MTr5_{mn}'$ to $MTr8_{mn}'$. Note that the gates of those memory transistors MTr are connected to the same word line $WL_{mn}'$ that are provided at the same position in the column direction and aligned in the row direction.

In addition, as illustrated in FIG. 2B, the word lines $WL_{mn}$, each of which is wired to be commonly connected to respective two columnar portions $CL_{mn}$, have a stair portion WLc with its row-direction ends formed in a stair-like manner. The stair portion WLc is connected to wirings M1 via contacts, from which voltages necessary for operation are supplied to the stair portion.

In addition, as illustrated in FIG. 3, an ONO (Oxide-Nitride-Oxide) layer NL is formed between word lines $WL_m$ and a columnar portion $CL_{mn}$. Each ONO layer NL has a tunnel insulation layer TI in contact with a columnar portion $CL_{mn}$, an electric charge storage layer EC in contact with the tunnel insulation layer TI, and a block insulation layer BI in contact with the electric charge storage layer EC. The electric charge storage layer EC has a function for accumulating electric charges. That is, the electric charge storage layer EC is formed to surround the side surface of the columnar portion $CL_{mn}$.

In addition, the respective word lines $WL_{mn}$ are formed to surround the side surface of the columnar portion $CL_{mn}$ as well as the electric charge storage layer EC. Note that the following description will be made based on the assumption: each columnar portion $CL_{mn}$ and each joining portion $JP_{mn}$ of this embodiment are formed in a cylindrical shape with a hollow portion HI provided therein; and they have a structure where the hollow portion HI is filled with an insulation film I, such as a silicon oxide film. Of course, the columnar portion and the joining portion may be entirely, including their interior parts, filled up with a conductive film such as polysilicon, without the hollow portion HI.

In addition, drain-side selection gate lines $SGD_m$, $SGD_m'$, and source-side selection gate lines $SGS_m$, $SGS_m'$ are formed above the word lines $WL_m$ as structures for providing selection transistors $SSTr_{mn}$, $SDTr_{mn}$, $SSTr_{mn}'$, $SDTr_{mn}'$. Each of the selection gate lines is formed to surround one columnar portion $CL_{mn}$, with the row direction taken as its longitudinal direction. In FIG. 2A, the drain-side selection gate lines $SGD_m$, $SGD_m'$ are formed to surround the middle two columnar portions $CL_{mn}$ of four columnar portions $CL_{mn}$ in one memory string $MS_{mn}$, respectively. In addition, the source-side selection gate lines $SGS_m$, $SGS_m'$ are formed to surround the rightmost and leftmost two columnar portions $CL_{mn}$, respectively.

Unlike the word lines WL, the drain-side selection gate lines $SGD_m$ and the source-side selection gate lines $SGS_m$ are formed on a one-to-one basis, i.e., one for each columnar portion $CL_{mn}$. In addition, they have a line width of about ⅖ that of the word lines WL (see FIG. 2A). As illustrated in FIG. 3, gate insulation layers DGI and SGI are formed between the drain-side selection gate line $SGD_m$ and the columnar portion $CL_{mn}$ (see FIG. 3).

In addition, as illustrated in FIG. 2A, source lines $SL_n$ are formed on the upper ends of the columnar portions $CL_{mn}$ at the right and left ends of one memory string $MS_{mn}$.

In addition, a bit line $BL_n$ is formed on the upper ends of the middle two columnar portions $CL_{mn}$ in one memory string $MS_{mn}$ via plug lines $PL_{mn}$. In short, a bit line $BL_n$ is connected to two of four columnar portions $CL_{mn}$, i.e., one half of four columnar portions $CL_{mn}$ provided in one memory string $MS_{mn}$, while source lines $SL_n$ are connected to the remaining two. The bit line $BL_n$ is formed to be located above the source lines $SL_n$ in the lamination direction. The bit lines $BL_n$ are repeatedly formed in lines extending in the column direction at a certain interval in the row direction.

The above-mentioned configuration can be clarified as follows. Each memory transistor MTr includes a columnar portion $CL_{mn}$, an ONO layer NL (an electric charge storage layer EC), and a word line $WL_{mn}$. One end of the word line $WL_{mn}$ in contact with the ONO layer NL functions as the control gate electrode of the memory transistor MTr. Each drain-side selection transistor $SDTr_{mn}$ includes a columnar portion $CL_{mn}$, a gate insulation layer DGI, and a drain-side selection gate line $SGD_m$.

One end of the drain-side selection gate line $SGD_m$ in contact with the gate insulation layer DGI functions as the control gate electrode of the drain-side selection transistor $SDTr_{mn}$. Each source-side selection transistor $SSTr_{mn}$ includes a columnar portion $CL_{mn}$, a gate insulation layer SGI, and a source-side selection gate line $SGS_m$. One end of the source-side selection gate line $SGS_m$ in contact with the gate insulation layer SGI functions as the control gate electrode of the source-side selection transistor $SSTr_{mn}$.

Each back-gate transistor $BGTr_{mn}$ includes a joining portion $JP_{mn}$, an ONO layer NL (an electric charge storage layer EC), and a back-gate line BG. One end of the back-gate line BG in contact with the ONO layer NL functions as the control gate electrode of the back-gate transistor $BGTr_{mn}$.

(Specific Configuration of Non-Volatile Semiconductor Device 100 in First Embodiment)

Figure 5:
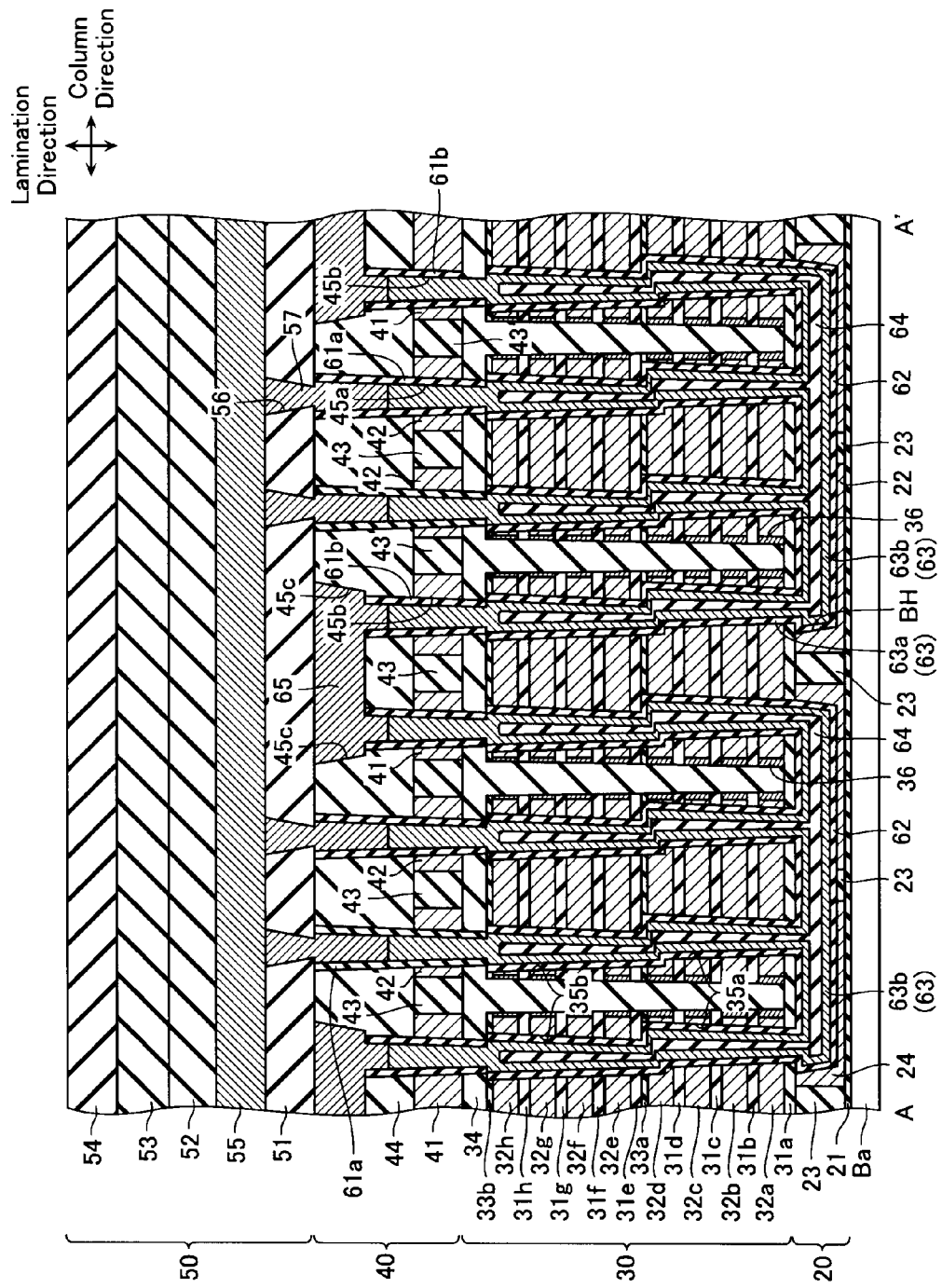
FIG. 5 is a cross-sectional view of the memory transistor area 12 according to the first embodiment.
Figure 6:
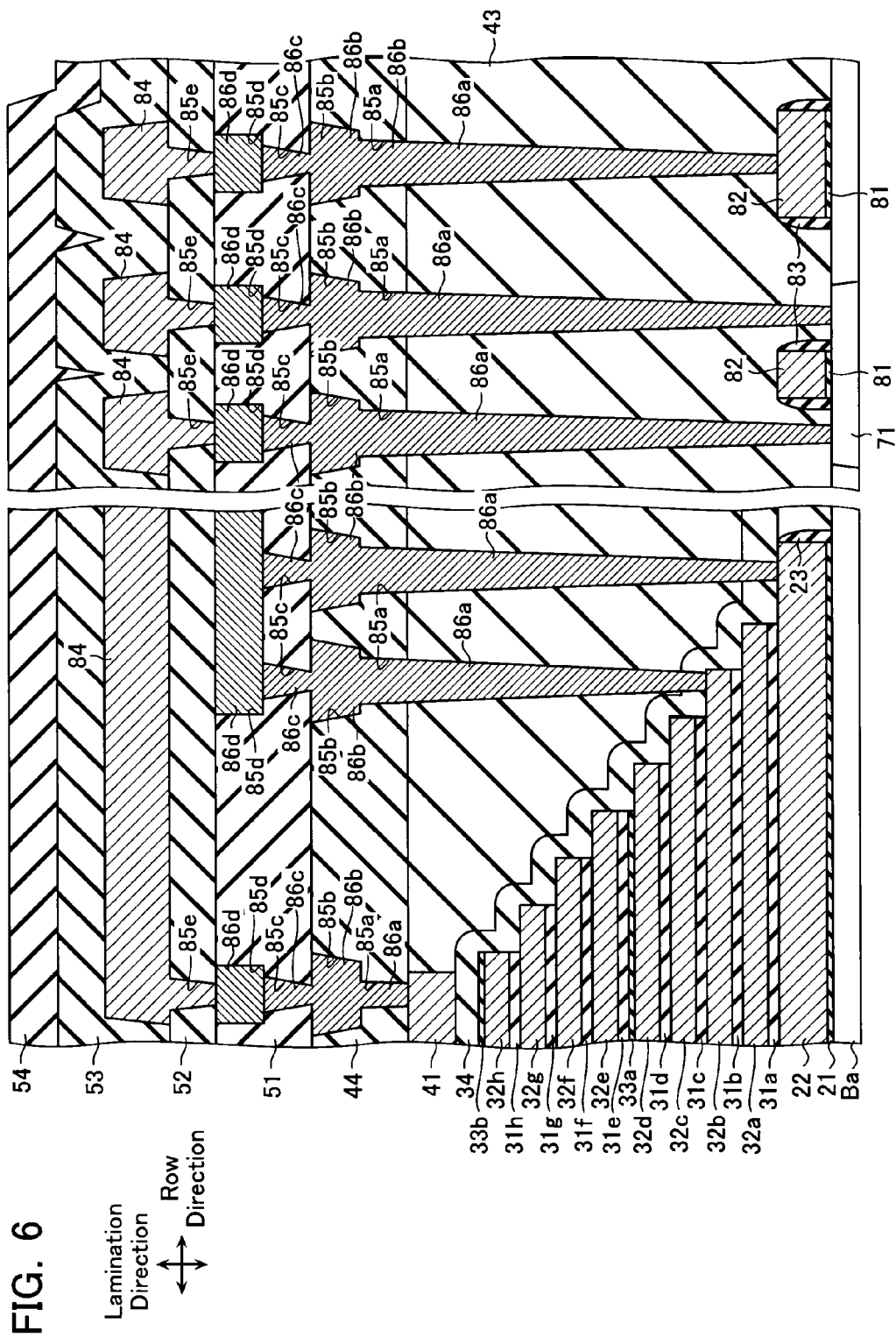
FIG. 6 is a cross-sectional view taken along the row direction, from one terminal of the memory transistor area 12 to a peripheral area Ph, according to the first embodiment.
Figure 7:
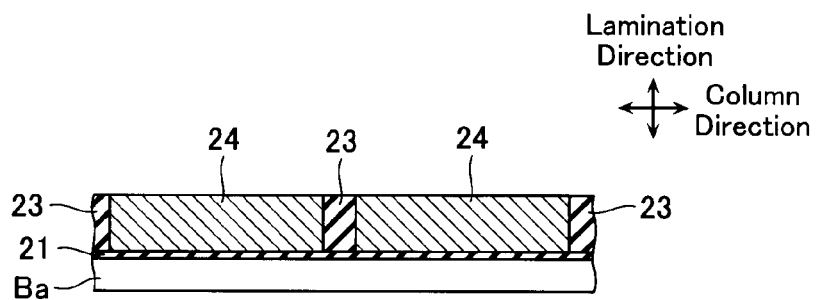
FIG. 7 is a cross-sectional view of the memory transistor area 12 in a manufacturing process according to the first embodiment.

Referring now to FIGS. 5 and 6, a specific configuration of the non-volatile semiconductor device 100 according to the first embodiment will be described below. FIG. 5 is a cross-sectional view of the memory transistor area 12 in the non-volatile semiconductor device 100 according to the first embodiment. FIG. 6 illustrates the configuration of the above-mentioned stair portion (the peripheral area). Note that unlike in FIGS. 1 to 4, FIGS. 5 and 6 illustrate a case where eight memory transistors are formed for each columnar portion $CL_{mn}$, and hence thirty-two memory transistors are connected in series and in parallel for each memory string $MS_{mn}$.

Firstly, a configuration of a memory cell transistor area 12 in the non-volatile semiconductor storage device 100 according to the first embodiment will be described below. As illustrated in FIGS. 5 and 6, the memory cell transistor area 12 (memory strings MS) has a back-gate transistor layer 20, a memory transistor layer 30, a selection transistor layer 40, and a wiring layer 50 on the semiconductor substrate Ba, in the stated order to the lamination direction. The back-gate transistor layer 20 functions as the above-mentioned back-gate transistors $BGTr_{mn}$. The memory transistor layer 30 functions as the above-mentioned memory transistors MTr. The selection transistor layer 40 functions as the above-mentioned source-side selection transistors $SSTr_{mn}$ and drain-side selection transistors $SDTr_{mn}$.

The back-gate transistor layer 20 has a back-gate insulation layer 21 and conductive layers 22 that are sequentially laminated on the semiconductor substrate Ba. The conductive layers 22 are insulated and isolated from each other in the row direction by trench insulation films 23. Back-gate conductive layers 24 are formed between the trench insulation films 23, with the row direction taken as their longitudinal direction. Meanwhile, the back-gate insulation layer 21 comprises, e.g., silicon oxide ($SiO_2$). The back-gate conductive layers 24 comprise, e.g., polysilicon (p-Si). The trench insulation films 23 comprise, e.g., silicon oxide ($SiO_2$).

The back-gate transistor layer 20 also has back-gate holes BH that are formed to dig into the conductive layers 22. The back-gate holes BH are apertures that take the row direction as their width direction and the column direction as their longitudinal direction. The back-gate holes BH are formed at a certain interval in the row and column directions. In other words, the back-gate holes BH are formed in a matrix form within a plane including the row and column directions.

The memory transistor layer 30 has first to fourth inter-wordline insulation layers 31a to 31d and first to fourth word-line conductive layers 32a to 32d that are alternately laminated on the back-gate conductive layers 22. The memory transistor layer 30 also has first isolation/insulation layers 33a that are deposited on the fourth word-line conductive layers 32d. The memory transistor layer 30 also has fifth to eighth inter-wordline insulation layers 31e to 31h and fifth to eighth word-line conductive layers 32e to 32h that are alternately laminated on the first isolation/insulation layers 33a. The memory transistor layer 30 also has second isolation/insulation layers 33b and memory protection/insulation layers 34 that are sequentially deposited on the eighth word-line conductive layers 32h.

The first to eighth inter-wordline insulation layers 31a to 31h, the first to eighth word-line conductive layers 32a to 32h, the first isolation/insulation layers 33a, and the second isolation/insulation layers 33b are formed to extend in the row direction and repeatedly formed in lines at a certain interval in the column direction. The first to eighth inter-wordline insulation layers 31a to 31h, the first to eighth word-line conductive layers 32a to 32h, the first isolation/insulation layers 33a, and the second isolation/insulation layers 33b are processed in a stair-like manner at their respective ends in the row direction as described below (which provides a stair portion WLc).

The memory protection/insulation layers 34 are formed to cover the respective ends in the row and column directions of the first to eighth inter-wordline insulation layers 31a to 31h, the first to eighth word-line conductive layers 32a to 32h, the first isolation/insulation layers 33a, and the second isolation/insulation layers 33b, as well as the top surfaces of the second isolation/insulation layers 33b. In addition, silicide films 36 are formed on the side surfaces of the respective ends in the column direction of the first to eighth word-line conductive layers 32a to 32h.

The first to eighth inter-wordline insulation layers 31a to 31h comprise, e.g., silicon oxide ($SiO_2$). The first to eighth word-line conductive layers 32a to 32h comprise, e.g., polysilicon (p-Si). The first isolation/insulation layers 33a and the second isolation/insulation layers 33b comprise, e.g., silicon oxide ($SiO_2$). The memory protection/insulation layers 34 comprise, e.g., silicon nitride (SiN). The silicide films 36 comprise, e.g., cobalt silicide ($CoSi_2$).

The memory transistor layer 30 also has first memory holes 35a that are formed to penetrate the first to fourth inter-wordline insulation layers 31a to 31d and the first to fourth word-line conductive layers 32a to 32d. The first memory holes 35a are formed so that their lower ends are located at substantially the same interval along the longitudinal direction of the respective back-gate holes BH. That is, the lower ends of four first memory holes 35a reach one back-gate hole BH.

In addition, the memory transistor layer 30 has second memory holes 35b that are formed to penetrate the second isolation/insulation layers 33b, the fifth to eighth inter-wordline insulation layers 31e to 31h, and the fifth to eighth word-line conductive layers 32e to 32h to reach the first memory holes 35a. This means that the first memory holes 35a and the second memory holes 35b are formed to overlap by a certain length in the lamination direction. This overlapping length represents a maximum value of the expected deviation of alignment, e.g., on the order of ⅓ the minimum feature size. Note that while each first memory hole 35a and each second memory hole 35b are formed with the offset central axes in FIG. 5, they may also be formed with the aligned central axes.

The selection transistor layer 40 has source-side conductive layers 41, drain-side conductive layers 42, and interlayer insulation layers 43 that are deposited on the memory protection/insulation layers 34. The source-side conductive layers 41, the drain-side conductive layers 42, and the interlayer insulation layers 43 are formed to extend in the row direction and repeatedly formed in lines at a certain interval in the column direction. The source-side conductive layers 41 and the drain-side conductive layers 42 are alternately formed two by two in the column direction. That is, two drain-side conductive layers 42 are successively provided corresponding to the middle two columnar portions $CL_{mn}$, in one memory string $MS_{mn}$, and then two source-side conductive layers 41 are successively provided, preceding another two drain-side conductive layers 42. The interlayer insulation layers 43 are formed between the source-side conductive layers 41 and the drain-side conductive layers 42 formed as described above.

In addition, the selection transistor layer 40 has selection transistor insulation layers 44 that are formed on the source-side conductive layers 41, the drain-side conductive layers 42, and the interlayer insulation layers 43.

The source-side conductive layers 41 and the drain-side conductive layers 42 comprise polysilicon (p-Si). The interlayer insulation layers 43 and the selection transistor insulation layers 44 comprise silicon oxide ($SiO_2$).

In addition, the selection transistor layer 40 has drain-side holes 45a that are formed to penetrate the selection transistor insulation layers 44 and the drain-side conductive layers 42. The selection transistor layer 40 also has source-side holes 45b that are formed to penetrate the selection transistor insulation layers 44 and the source-side conductive layers 41. The drain-side holes 45a and the source-side holes 45b are formed at positions matching the second memory holes 35b. A source-line wiring trench 45c is formed on the source-side holes 45b adjacent in the column direction, so as to dig into a selection transistor insulation layer 44. Each source-line wiring trench 45c is formed to connect the upper portions of the source-side holes 45b adjacent in the column direction, with the row direction taken as its longitudinal direction.

In the above-mentioned configuration, drain-side gate insulation layers 61a are formed on the sidewalls of the drain-side holes 45a. In addition, source-side gate insulation layers 61b are formed on the sidewalls of the source-side holes 45b.

In addition, memory gate insulation layers 62 are formed on the respective sidewalls of the first memory holes 35a, the second memory holes 35b, and the back-gate holes BH. Furthermore, body semiconductor layers 63 are formed as high as a first height of the drain-side holes 45a and the source-side holes 45b so as to come in contact with the drain-side gate insulation layers 61a, the source-side gate insulation layers 61b, and the memory gate insulation layers 62. Each body semiconductor layer 63 has a hollow. An internal insulation layer 64 is formed in the hollow of the body semiconductor layer 63.

Each drain-side gate insulation layer 61a and each source-side gate insulation layer 61b have a cylindrical shape. Each memory gate insulation layer 62 has a hollow that runs from one of its upper ends to the other. Each body semiconductor layer 63 has a fork-like shape as viewed from the row direction. Each body semiconductor layer 63 has four columnar portions 63a that extend in a vertical direction to the semiconductor substrate Ba as viewed from the row direction, and a joining portion 63b that is formed to join the lower ends of the four columnar portions 63a.

Each body semiconductor layer 63 functions as the channel region (body) of memory transistors MTr and back-gate transistors $BGTr_{mn}$ that are formed in a memory string $MS_{mn}$. Back-gate conductive layers 22 function as back-gate lines BG1 and BG2. In addition, those ends of the back-gate conductive layers 22 that are located near the joining portion 63b function as the control gates of the back-gate transistors $BGTr_{mn}$.

The first to eighth word-line conductive layers 32a to 32h function as word lines $WL_m1$ to $WL_m8$ and $WL_m5'$ to $WL_m8'$. In addition, the source-side conductive layers 41 function as source-side selection gate lines $SGS_m$ and $SGS_m'$. The drain-side conductive layers 42 function as drain-side selection gate lines $SGD_m$ and $SGD_m'$.

In addition, in the above-mentioned configuration, each source-line conductive layer 65 is formed to fill in a respective source-line wiring trench 45c. The source-line conductive layers 65 are formed in a plate-like shape parallel to the semiconductor substrate Ba. The source-line conductive layers 65 correspond to the above-mentioned source lines $SL_n$.

The drain-side gate insulation layers 61a and the source-side gate insulation layers 61b comprise, e.g., silicon oxide ($SiO_2$). Each memory gate insulation layer 62 comprises, e.g., a block insulation layer BI, an electric charge storage layer EC, and a tunnel insulation layer TI. The block insulation layer BI comprises, e.g., silicon oxide ($SiO_2$). The electric charge storage layer EC comprises, e.g., silicon nitride (SiN). The tunnel insulation layer TI comprises, e.g., silicon oxide ($SiO_2$). This means that each memory gate insulation layer 62 comprises an ONO layer. The body semiconductor layers 63 comprise, e.g., polysilicon (p-Si). The internal insulation layers 64 comprise, e.g., silicon oxide ($SiO_2$). The source-line conductive layers 65 comprise, e.g., a lamination structure of titanium (Ti)-titanium nitride (TiN)-tungsten (W).

The wiring layer 50 has first wiring insulation layers 51, second wiring insulation layers 52, third wiring insulation layers 53, and fourth wiring insulation layers 54 that are sequentially laminated on the selection transistor insulation layers 44.

The first to third wiring insulation layers 51 to 53 comprise, e.g., silicon oxide ($SiO_2$). The fourth wiring insulation layers 54 comprise, e.g., silicon nitride (SiN).

In addition, the wiring layer 50 has bit-line plug holes 56 that are formed to dig into the first wiring insulation layers 51. The bit-line plug holes 56 are formed at positions matching the drain-side holes 45a. Formed in the bit-line plug holes 56 are bit-line plug layers 57 that are connected to bit-line conductive layers 55 corresponding to bit lines.

The bit-line conductive layers 55 are formed to extend in the column direction, and repeatedly formed in lines at a certain interval in the row direction. The bit-line conductive layers 55 comprise, e.g., tantalum (Ta)-tantalum nitride (TaN)-copper (Cu). The bit-line plug layers 57 comprise, e.g., titanium (Ti)-titanium nitride (TiN)-tungsten (W).

A peripheral area Ph of the non-volatile semiconductor storage device according to the first embodiment will now be described below. As illustrated in FIG. 6, base regions 71 are formed on the semiconductor substrate Ba in the peripheral area Ph. Gate insulation layers 81 and gate conductive layers 82 are provided on the base regions 71 of the semiconductor substrate Ba. In addition, sidewall insulation layers 83 are provided on the respective sidewalls of the gate insulation layers 81 and the gate conductive layers 82. This means that the base regions 71, the gate insulation layers 81, and the gate conductive layers 82 together form transistors in the peripheral area Ph. The transistors are used for peripheral circuits formed in the peripheral area Ph.

In addition, interlayer insulation layers 43 are formed as high as the respective top surfaces of drain-side conductive layers 42 and source-side conductive layers 41 in the memory transistor area 12 so as to fill up the gate insulation layers 81, the gate conductive layers 82, and the sidewall insulation layers 83. In addition, selection transistor insulation layers 44 are formed on the interlayer insulation layers 43.

Furthermore, first wiring insulation layers 51, second wiring insulation layers 52, third wiring layers 84, third wiring insulation layers 53, and fourth wiring insulation layers 54 are formed and sequentially laminated on the selection transistor insulation layers 44 in the peripheral area Ph. In the peripheral area Ph, first plug holes 85a are formed to penetrate the selection transistor insulation layers 44 or both the selection transistor insulation layers 44 and the interlayer insulation layers 43. The first plug holes 85a are formed to reach the drain-side conductive layers 42, the source-side conductive layers 41, the first to eighth word-line conductive layers 32a to 32h, the back-gate conductive layers 22, the gate conductive layers 82, or the base regions 71, respectively.

First wiring trenches 85b are formed on the respective first plug holes 85a that extend in the column direction so as to dig into the selection transistor insulation layers 44. Second plug holes 85c are formed on the respective first wiring trenches 85b at positions matching the first plug holes 85a so as to penetrate the first wiring insulation layers 51. Second wiring trenches 85d are formed on the respective second plug holes 85c that extend in the row or column direction so as to dig into the first wiring insulation layers 51. Third plug holes 85e are formed on the respective second wiring trenches 85d at positions matching the second plug holes 85c so as to penetrate the second wiring insulation layers 52.

First plug conductive layers 86a are formed in the respective first plug holes 85a. First wiring layers 86b are formed in the respective first wiring trenches 85b. Second plug conductive layers 86c are formed in the respective second plug holes 85c. Second wiring layers 86d are formed in the respective second wiring trenches 85d. Formed in the respective third plug holes 85e are third wiring layers 84 that protrude downward therefrom to come in contact with the top surfaces of the respective second wiring layers 86d.

The first plug conductive layers 86a, the first wiring layers 86b, and the second plug conductive layers 86c comprise, e.g., titanium (Ti)-titanium nitride (TiN)-tungsten (W). The second wiring layers 86d comprise, e.g., tantalum (Ta)-tantalum nitride (TaN)-copper (Cu). The third wiring layers 84 comprise, e.g., titanium (Ti)-titanium nitride (TiN)-aluminum copper (AlCu).

(Manufacturing Method of Non-Volatile Semiconductor Storage Device 100 in First Embodiment)

Referring now to FIGS. 7 to 16, as an example, a manufacturing method of the non-volatile semiconductor storage device 100 according to the first embodiment will be described below.

Firstly, after deposition of silicon oxide ($SiO_2$) and polysilicon (p-Si) on the semiconductor substrate Ba, a back-gate insulation layer 21, trench insulation films 23, and back-gate conductive layers 24 are formed using lithography, RIE (Reactive Ion Etching), and ion implantation methods.

Figure 8:
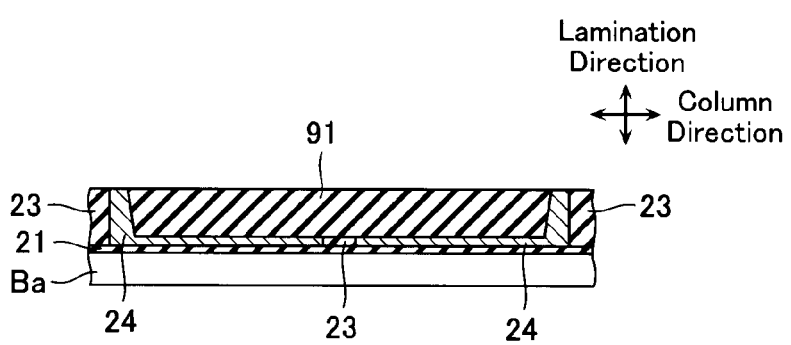
FIG. 8 is a cross-sectional view of the memory transistor area 12 in the manufacturing process according to the first embodiment.

Then, as illustrated in FIG. 8, the back-gate conductive layers 24 are dug down in the memory transistor area 12 to form a back-gate hole BH. The back-gate hole BH is formed so that it has an insular aperture with the column direction taken as its longitudinal direction. Such back-gate holes BH are formed at a certain interval in the row and column directions. Then, silicon nitride (SiN) is deposited to fill in the back-gate hole BH. Subsequently, silicon nitride (SiN) on the back-gate conductive layer 22 is removed by the Chemical Mechanical Polishing (CMP) or RIE method to form a first sacrificial layer 91 in the back-gate hole BH.

Figure 9:
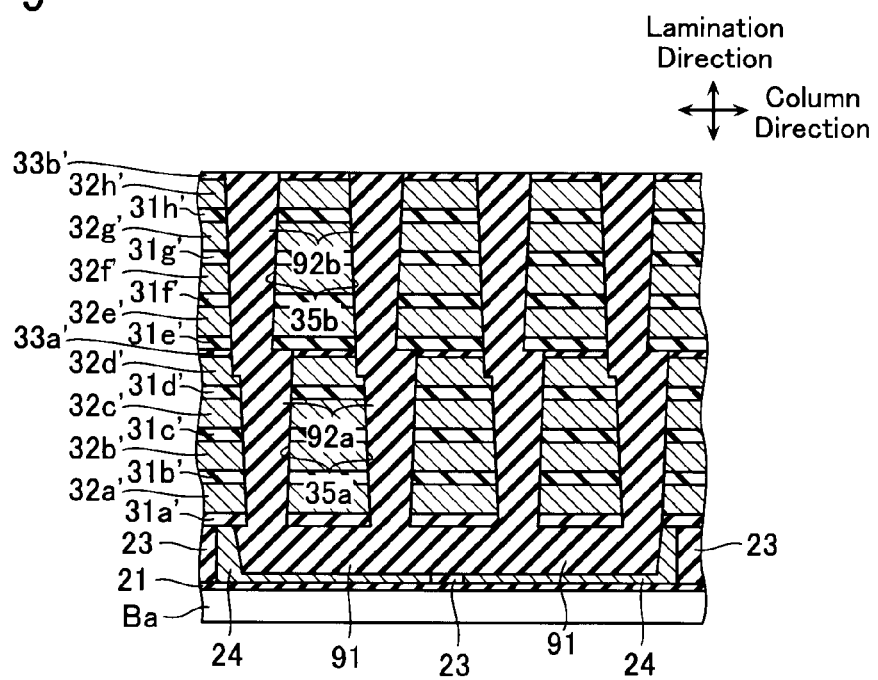
FIG. 9 is a cross-sectional view of the memory transistor area 12 in the manufacturing process according to the first embodiment.

Then, as illustrated in FIG. 9, some steps are performed to form a memory string $MS_{mn}$. That is, silicon oxide ($SiO_2$) and polysilicon (p-Si) are alternately laminated on the back-gate conductive layer 22 and the sacrificial layer 91, thereby forming first to fourth plate-like inter-wordline insulation layers 31a' to 31d', first to fourth plate-like polysilicon conductive layers 32a' to 32d', and a first plate-like isolation/insulation layer 33a'. The first to fourth plate-like inter-wordline insulation layers 31a' to 31d', the first to fourth plate-like polysilicon conductive layers 32a' to 32d', and the first plate-like isolation/insulation layer 33a' are each formed to expand in a two-dimensional manner in the directions perpendicular to the lamination direction (i.e., in the row and column directions).

Subsequently, as illustrated in FIG. 9, first memory holes 35a are formed to penetrate the first to fourth plate-like inter-wordline insulation layers 31a' to 31d', the first to fourth plate-like polysilicon layers 32a' to 32d', and the first plate-like isolation/insulation layer 33a'. Silicon nitride (SiN) is deposited in the first memory holes 35a to form second sacrificial layers 92a.

Furthermore, as illustrated in FIG. 9, silicon oxide ($SiO_2$) and polysilicon (p-Si) are alternately laminated on the first plate-like isolation/insulation layers 33a', thereby forming fifth to eighth plate-like inter-wordline insulation layers 31e' to 31h', fifth to eighth plate-like polysilicon layers 32e' to 32h', and a second plate-like isolation/insulation layer 33b'.

The fifth to eighth plate-like inter-wordline insulation layers 31e' to 31h', the fifth to eighth plate-like polysilicon layers 32e' to 32h', and the second plate-like isolation/insulation layer 33b' are each formed to expand in a two-dimensional manner in the directions perpendicular to the lamination direction (i.e., in the row and column directions).

Subsequently, second memory holes 35b are formed to penetrate the second plate-like isolation/insulation layer 33b', the fifth to eighth plate-like inter-wordline insulation layers 31e' to 31h', the fifth to eighth plate-like polysilicon layers 32e' to 32h', and the first plate-like isolation/insulation layers 33a'. In addition, the second memory holes 35b are formed at positions matching the first memory holes 35a. Silicon nitride (SiN) is deposited in the second memory holes 35b to form third sacrificial layers 92b. Note that while FIGS. 9 and 10 illustrates a case where memory holes 35a and 35b are separately formed, the memory holes 35a and 35b may of course be formed at a time.

Figure 10:
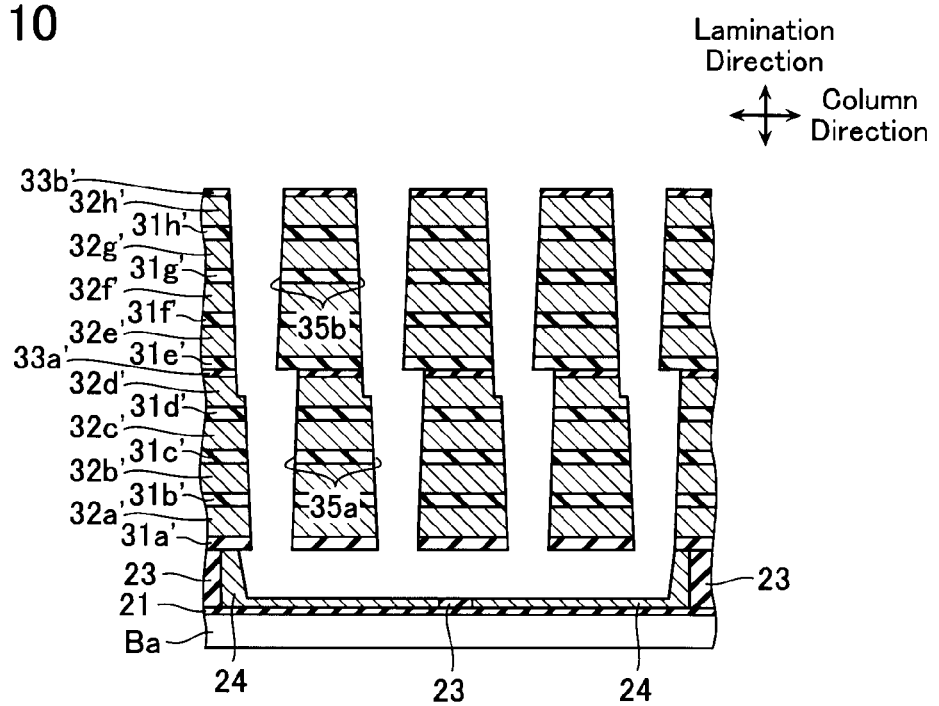
FIG. 10 is a cross-sectional view of the memory transistor area 12 in the manufacturing process according to the first embodiment.

Then, the first sacrificial layer 91, the second sacrificial layers 92a, and the third sacrificial layers 92b are removed as illustrated in FIG. 10. For example, removal of the first sacrificial layer 91, the second sacrificial layers 92a, and the third sacrificial layers 92b is performed in a hot phosphoric acid solution. Through these steps, first memory holes 35a, second memory holes 35b, and back-gate hole BH are formed again. The first memory holes 35a, the second memory holes 35b, and the back-gate hole BH are in communication with each other, and they are formed in a fork-like shape in relation to each other as viewed from the row direction. Then, a diluted hydrofluoric acid treatment is performed to clean up, and remove any natural oxide films from, the exposed surfaces of the back-gate conductive layer 22 and the first to eighth plate-like polysilicon layers 32a' to 32h'.

Figure 11:
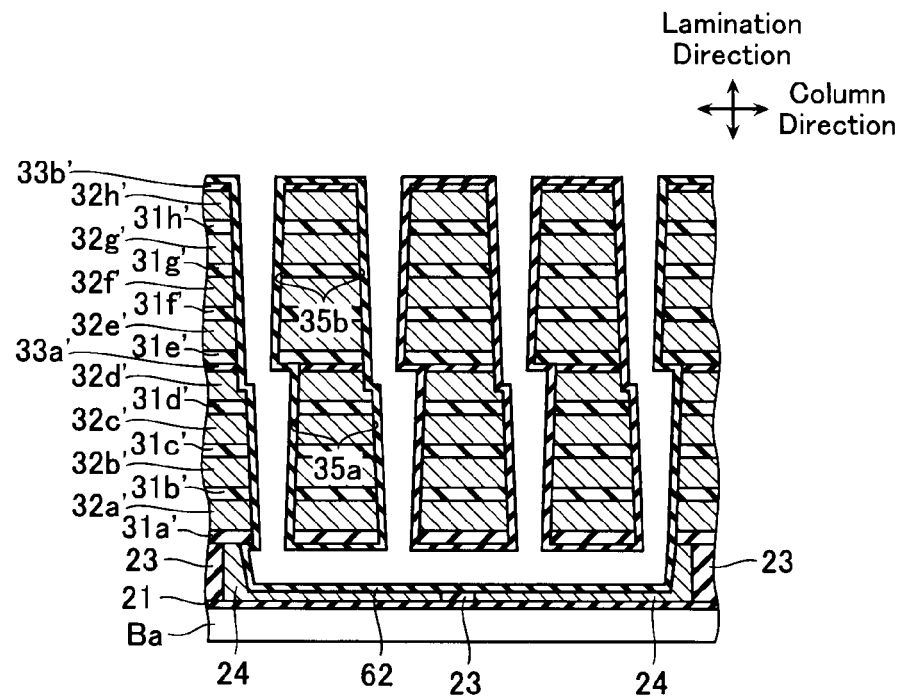
FIG. 11 is a cross-sectional view of the memory transistor area 12 in the manufacturing process according to the first embodiment.

Subsequently, as illustrated in FIG. 11, a memory gate insulation layer 62 is formed to cover the sidewalls of the back-gate hole BH, the first memory holes 35a, and the second memory holes 35b, as well as the second plate-like isolation/insulation layers 33b'. Specifically, the memory gate insulation layer 62 is formed by deposition of silicon oxide ($SiO_2$), silicon nitride (SiN), and silicon oxide ($SiO_2$).

Figure 12:
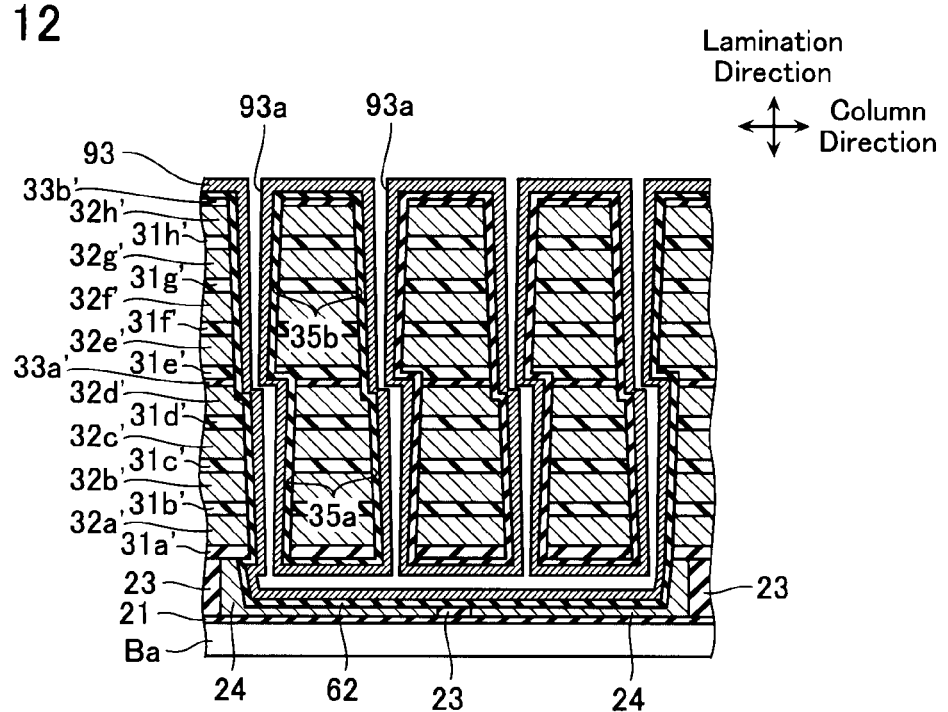
FIG. 12 is a cross-sectional view of the memory transistor area 12 in the manufacturing process according to the first embodiment.

Then, as illustrated in FIG. 12, amorphous silicon (a-Si) is deposited on the memory gate insulation layer 62 to form an amorphous silicon layer 93. The amorphous silicon layer 93 is formed to have a hollow 93a. In other words, the amorphous silicon layer 93 is formed so that it will not completely fill up the back-gate hole BH, the first memory holes 35a, and the second memory holes 35b.

Figure 13:
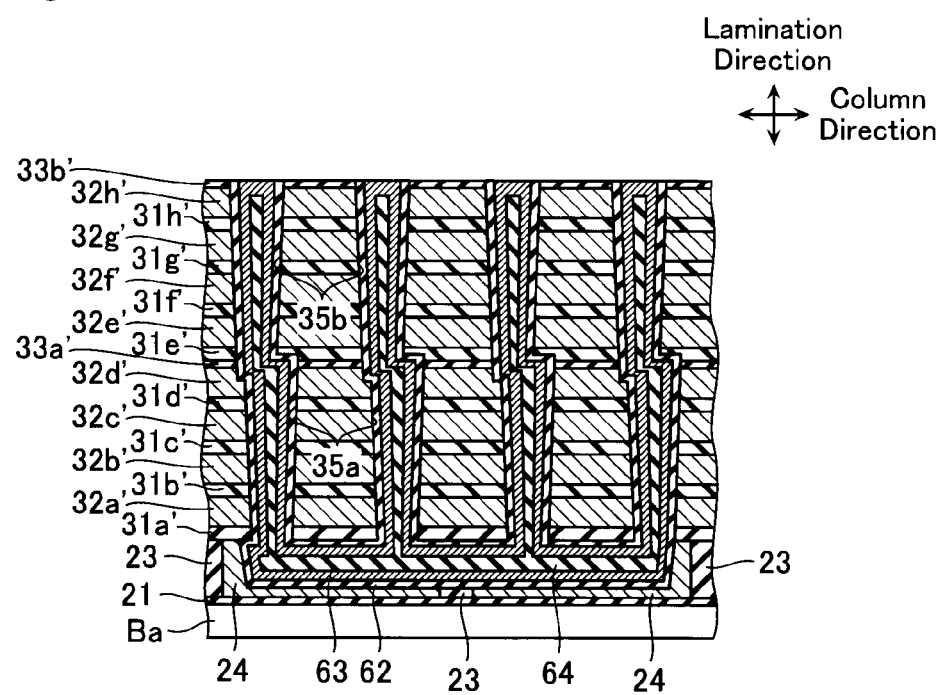
FIG. 13 is a cross-sectional view of the memory transistor area 12 in the manufacturing process according to the first embodiment.
Figure 14:
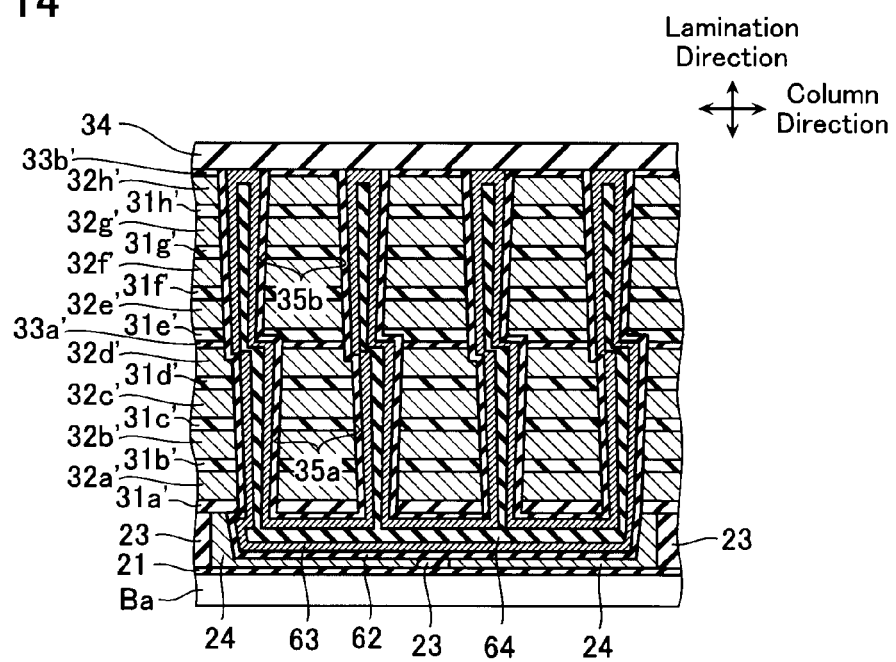
FIG. 14 is a cross-sectional view of the memory transistor area 12 in the manufacturing process according to the first embodiment.

Subsequently, as illustrated in FIG. 13, the sidewalls of the amorphous silicon layer 93 facing the hollow 93a are thermally oxidized to form silicon oxide ($SiO_2$). In addition, the remaining portions of the amorphous silicon layer 93 are crystallized to form polysilicon (p-Si). As a result, a body semiconductor layer 63 is formed.

In addition, silicon oxide ($SiO_2$) is further deposited on the silicon oxide ($SiO_2$) formed in the hollow 93a of the body semiconductor layer 63 using the CVD (Chemical Vapor Deposition) method. Then, an internal insulation layer 64 is formed to fill up the hollow 93a. Furthermore, those portions of the memory gate insulation layer 62, the body semiconductor layer 63, and the internal insulation layer 64 are removed by CMP process that are deposited on the second plate-like isolation/insulation layers 33b'.

Figure 15:
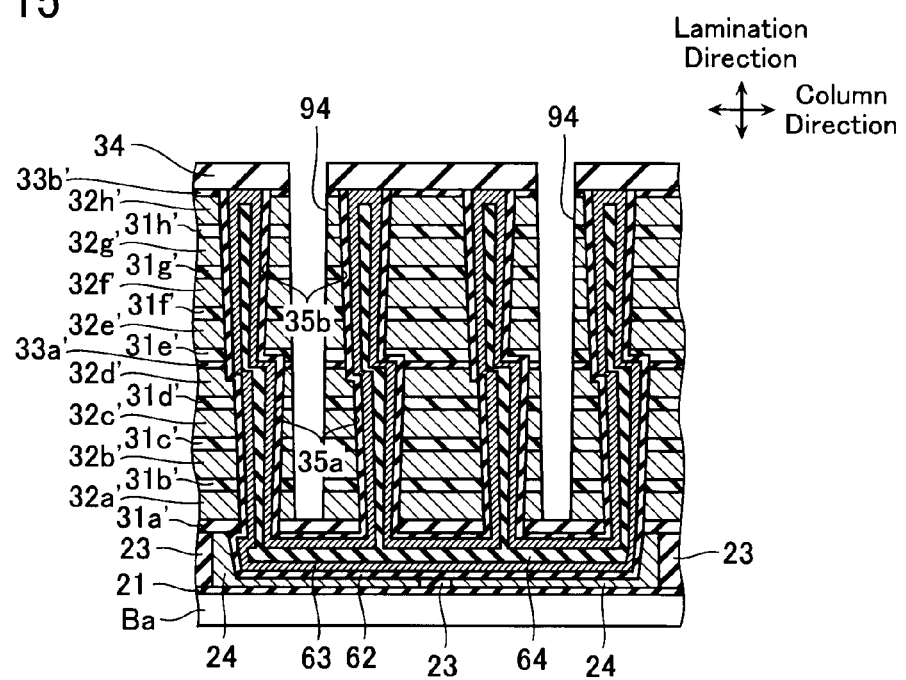
FIG. 15 is a cross-sectional view of the memory transistor area 12 in the manufacturing process according to the first embodiment.

Then, silicon nitride is deposited on the second plate-like isolation/insulation layers 33b' to form a memory protection/insulation layer 34. Subsequently, as illustrated in FIG. 15, memory isolation trenches 94 are formed to extend in the row direction so that they are repeatedly formed in lines at a certain interval in the column direction. The memory isolation trenches 94 are formed to be located between the first memory holes 35a and the second memory holes 35b in the column direction. The memory isolation trenches 94 are formed to penetrate the memory protection/insulation layer 34, the first to eighth plate-like inter-wordline insulation layers 31a' to 31h', the first to eighth plate-like polysilicon layers 32a' to 32h', and the first and second isolation/insulation layers 33a', 33b'. After the formation of the memory isolation trenches 94, the first to eighth plate-like inter-wordline insulation layers 31a' to 31h' become first to eighth inter-wordline insulation layers 31a to 31h, and the first to eighth plate-like polysilicon layers 32a' to 32h' become first to eighth word-line conductive layers 32a to 32h.

Figure 16:
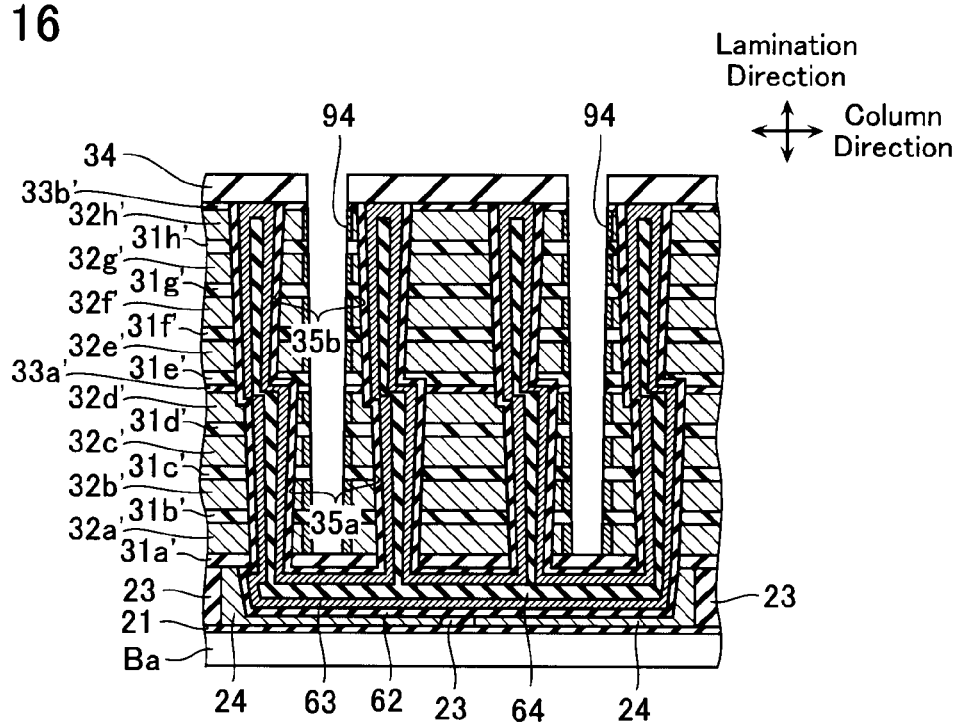
FIG. 16 is a cross-sectional view of the memory transistor area 12 in the manufacturing process according to the first embodiment.

Subsequently, as illustrated in FIG. 16, cobalt (Co) films are deposited on the side surfaces of the memory isolation trenches 94 using the CVD method. Furthermore, an RTA (Rapid Thermal Annealing) treatment is performed to cause the cobalt films to react in a self-alignment manner with the polysilicon (p-Si) contained in the first to eighth word-line conductive layers 32a to 32h. As a result, silicide films 36 are formed on the surfaces of the first to eighth word-line conductive layers 32a to 32h. Note that any unreacted cobalt films are removed in an aqueous solution of sulfuric acid-hydrogen peroxide mixture. Then, although not illustrated, the memory isolation trenches 94 are filled with silicon nitride (SiN), forming memory protection/insulation layers 34 so as to extend into the memory isolation trenches 94. Thereafter, the selection transistor layer 40 and the wiring layer 50 are formed in a similar way to that described in Patent Document 1, and so on, to complete the structure as illustrated in FIG. 5.

[Operation in First Embodiment]

Referring now to FIGS. 17 to 20, the operations of the non-volatile semiconductor storage device according to the first embodiment will be described below.

[Data Read Operation]

Figure 17:
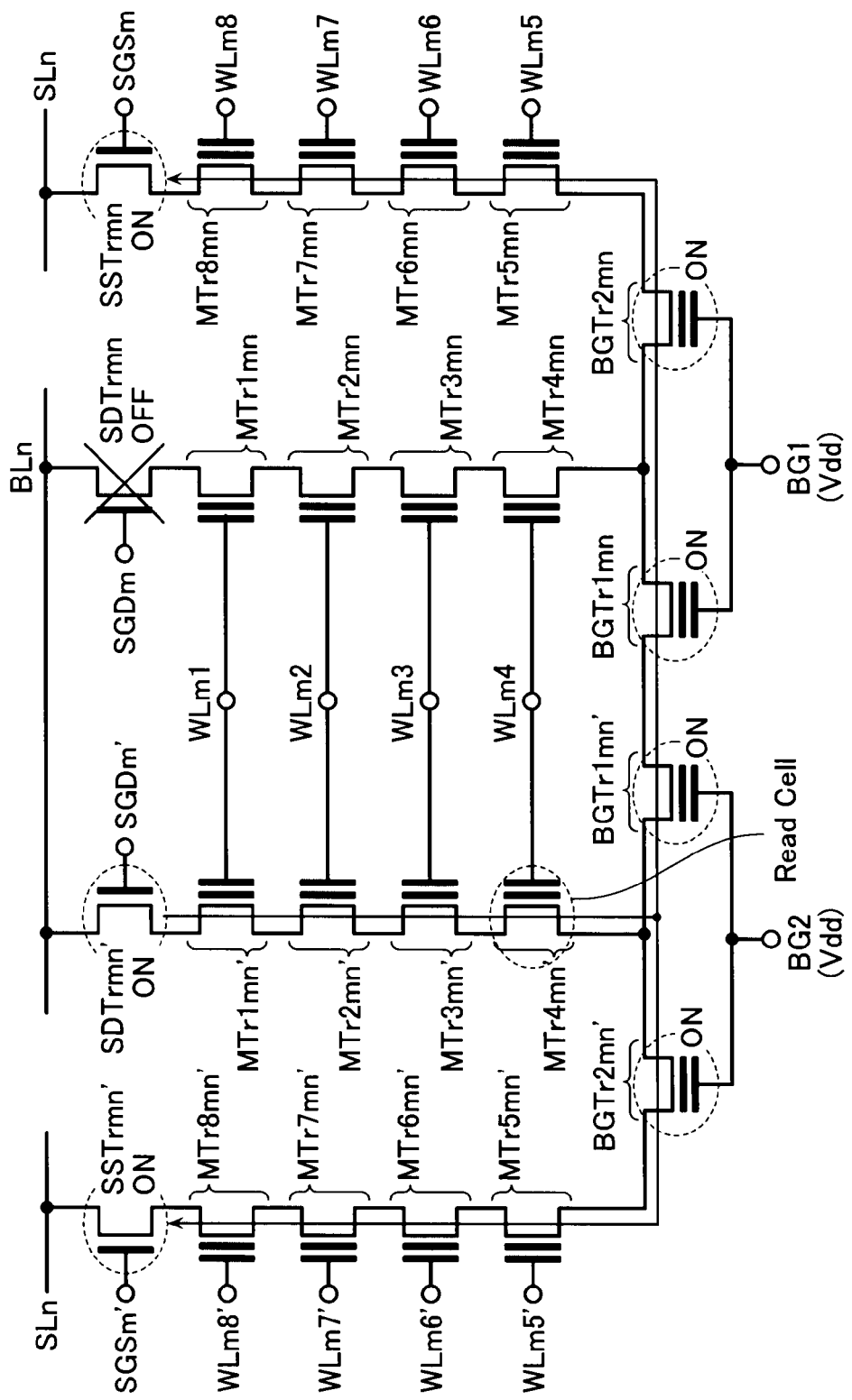
FIG. 17 is a circuit diagram illustrating a data read operation of the non-volatile semiconductor storage device according to the first embodiment (when reading data from one of the memory transistors MTr formed in a columnar portion $CL_{mn}$ connected to a bit line $BL_n$)
Figure 18:
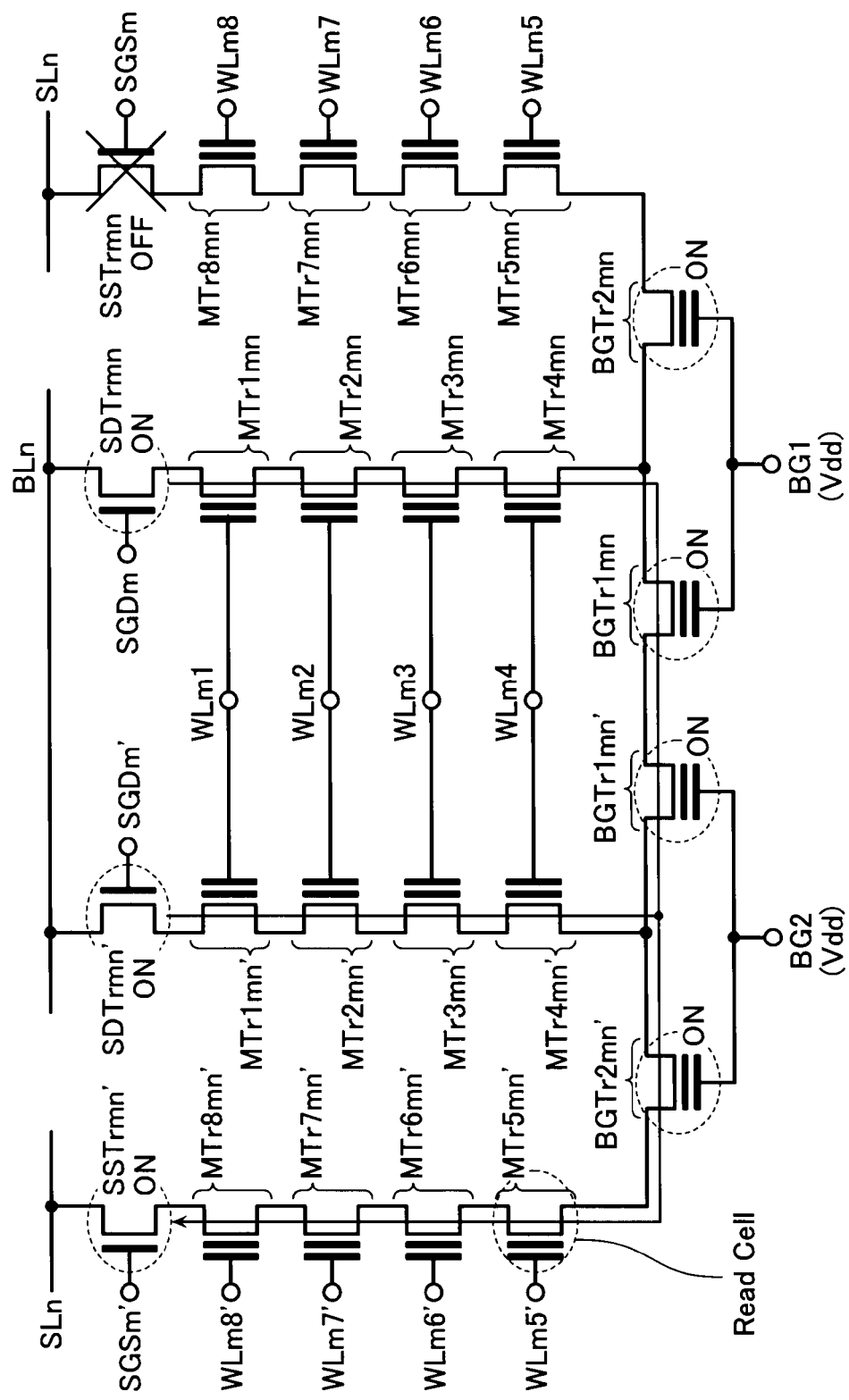
FIG. 18 is a circuit diagram illustrating a data read operation of the non-volatile semiconductor storage device according to the first embodiment (when reading data from one of the memory transistors MTr formed in a columnar portion $CL_{mn}$ connected to a source line $SL_n$)

Referring first to FIG. 17 and FIG. 18, a data read operation will be described below. FIGS. 17 and 18 both illustrate the conduction states of selection transistors $SDTr_{mn}$, $SDTr_{mn}'$, $SSTr_{mn}$, $SSTr_{mn}'$, and back-gate transistors BGTr, as well as the current flowing through one memory string MS in reading data. However, these transistors have different conduction states depending on the position of the memory transistor MTr selected for reading.

[Read Data from a Memory Transistor Formed in a Columnar Portion $CL_{mn}$ Connected to a Bit Line $BL_n$ (Read (BL-Side))]

Referring first to FIG. 17, the following description will be made on a case where one of the memory transistors MTr formed in a columnar portion $CL_{mn}$ connected to a bit line $BL_n$, e.g., $MTr4_{mn}'$, is selected for reading. In this case, a voltage Vbl is applied to the bit line $BL_n$, a power supply voltage Vdd is applied to the selection gate line $SGD_m'$ of the selected drain-side selection transistor $SDTr_{mn}'$, and a ground potential Vss is applied to the selection gate line $SGD_m$ of the unselected drain-side selection transistor $SDTr_{mn}$. Consequently, only the drain-side selection transistor $SDTr_{mn}'$ becomes conductive that is connected in series to the memory transistor $MTr4_{mn}'$, while the other drain-side selection transistor $SDTr_{mn}$ is maintained in a non-conductive state (see FIG. 17).

On the other hand, the ground potential Vss is applied to the source lines $SL_n$, and the power supply voltage Vdd is applied to the source-side selection gate lines $SGS_m$ and $SGS_m'$, by which the source-side selection transistors $SSTr_{mn}$ and $SSTr_{mn}'$ are both switched to conductive states (ON) (see FIG. 17). In addition, the back-gate transistors $BGTr1_{mn}$, $BGTr2_{mn}$, $BGTr1_{mn}'$, and $BGTr2_{mn}'$ are all maintained in conductive states (ON) as a read voltage Vread (on the order of 4.5V) is applied to the back-gate lines BG1 and BG2. Note that in this embodiment, the applied read voltage Vread is on the order of 4.5V because the gate insulation films of the back-gate transistors BGTr have electric charge storage films EC, as illustrated in FIG. 3. However, if the gate insulation films of the back-gate transistors VGTr are formed without electric charge storage films, then the voltage to be applied to the back-gate lines BG1 and BG2 may be the power supply voltage Vdd.

Under these conditions, the ground potential Vss is applied to the word line $WL_{mn}4$ which is connected to the memory transistor $MTr4_{mn}'$ for reading. On the other hand, such a read voltage Vread (on the order of 4.5V) is applied to the other word lines $WL_m1$ to 3, $WL_m5$ to 8, and $WL_m5'$ to 8' that causes memory transistors MTr to become conductive, regardless of the data retained in the memory transistors.

Providing these voltage application conditions, in the memory string $MS_{mn}$ including the memory transistor for reading, the reading current flows through one columnar portion $CL_{mn}$ including the selected memory transistor $MTr4_{mn}'$ and through the joining portion $JP_{mn}$. Then, it flows in parallel through all (in this case two) columnar portions $CL_{mn}$ that are connected to the source lines $SL_n$. In this way, the reading current is allowed to flow in parallel through multiple columnar portions $CL_{mn}$, which may result in a reduction in the resistance value of the current path of the reading current. Note that while FIG. 17 illustrates an exemplary case where the memory transistor $MTr4_{mn}'$ is being read, a data read operation may also be performed in the same way as described above when reading another of the memory transistors $MTr1_{mn}'$ to $MTr3_{mn}'$ in the same columnar portion $CL_{mn}$, with only a change in the voltage states of the word lines WL. The same is true for the memory transistors $MTr1_{mn}$ to $MTr4_{mn}$ at symmetrical positions.

[Read Data from a Memory Transistor Formed in a Columnar Portion $CL_{mn}$ Connected to a Source Line $SL_n$ (Read (SLSide))]

In contrast, if one of the memory transistors MTr formed in a columnar portion $CL_{mn}$ connected to a source line SLn, e.g., $MTr5_{mn}'$, is selected for reading, then the read operation is performed in a different way from that illustrated in FIG. 17. This is described with reference to FIG. 18. In this case, the voltage Vbl is applied to the bit line $BL_n$, and the power supply voltage Vdd is applied to both the selection gate lines $SGD_m$ and $SGD_m'$ of the drain-side selection transistors $SDTr_{mn}$ and $SDTr_{mn}'$. In addition, the ground potential Vss is applied to the selection gate line $SGS_m$ of the source-side selection transistor $SSTr_{mn}$, while the power supply voltage Vdd is applied to the selection gate line $SGS_m'$ of the source-side selection transistor $SSTr_{mn}'$.

Consequently, only the source-side selection transistor $SSTr_{mn}'$ is switched to a conductive state (ON), while the other source-side selection transistor $SSTr_{mn}$ is maintained in a non-conductive state (OFF) (see FIG. 18). In addition, the drain-side selection transistors $SDTr_{mn}$ and $SDTr_{mn}'$ are both switched to conductive states (ON).

Under these conditions, the ground potential Vss is applied to the word line WLm5 which is connected to the memory transistor $MTr5_{mn}'$ for reading. On the other hand, such a read voltage Vread (on the order of 4.5V) is applied to the other word lines $WL_m1$ to 4, $WL_m5$ to 8, and $WL_m6'$ to 8' that causes memory transistors MTr to become conductive, regardless of the data retained in the memory transistors. In addition, the back-gate transistors $BGTr1_{mn}$, $BGTr2_{mn}$, $BGTr1_{mn}'$, and $BGTr2_{mn}'$ are all maintained in conductive states (ON) as the read voltage Vread (on the order of 4.5V) is applied to the back-gate lines BG1 and BG2.

Providing these conditions, in the memory string $MS_{mn}$ including the memory transistor for reading, the reading current flows in parallel through all (in this case two) columnar portions $CL_{mn}$ that are connected to the bit line $BL_n$. Then, it flows through one columnar portion $CL_{mn}$ including the selected memory transistor $MTr5_{mn}'$. In this way, the reading current is allowed to flow in parallel through multiple columnar portions $CL_{mn}$, which may result in a reduction in the resistance value of the current path of the reading current.

Note that while FIG. 18 illustrates an exemplary case where the memory transistor $MTr5_{mn}'$ is being read, a data read operation may also be performed in the same way as described above when reading another of the memory transistors $MTr6_{mn}'$ to $MTr8_{mn}'$ in the same columnar portion $CL_{mn}$, with only a change in the voltage states of the word lines WL. The same is true for the memory transistors $MTr5_{mn}$ to $MTr8_{mn}$ at symmetrical positions.

In the following, advantages of this embodiment will be described as compared with prior Japanese Patent Application No. 2007-320215, filed by the same assignee. In this prior application, each memory string $MS_{mn}$ has a U-shape including a pair of columnar portions $CL_{mn}$ and one joining portion $JP_{mn}$. Consequently, each memory string $MS_{mn}$, which has, e.g., eight memory transistors connected in series, is formed to extend downward from a bit line BL, then turn around at the joining portion $JP_{mn}$, and extend upward therefrom toward a source line SL (i.e., in U-shape). The U-shaped memory string $MS_{mn}$ has two ends to which a drain-side selection transistor and a source-side selection transistor are connected, respectively. Both of the drain-side selection transistor and the source-side selection transistor become conductive in reading data.

However, in such a U-shaped memory string $MS_{mn}$, the reading current flows in order of: one columnar portion $CL_{mn} \rightarrow$ one joining portion $JP_{mn} \rightarrow$ another columnar portion $CL_{mn}$. Due to this configuration, the columnar portion $CL_{mn}$ becomes longer and longer as one memory string $MS_{mn}$ includes a larger number of (laminated) memory transistors, which results in an increase in the resistance value of the current path of the reading current. Accordingly, the reading current becomes smaller and smaller as one memory string MS includes more memory cells, which makes read operation more difficult.

In this regard, each memory string $MS_{mn}$ according to this embodiment has a fork-like shape with a plurality of U-shaped memory strings joined by a joining portion. In reading data, the reading current flows in parallel through multiple columnar portions $CL_{mn}$. Therefore, even as compared with the above-mentioned prior application, this embodiment may obtain a larger reading current, less likely involve incorrect read operations, and more beneficial in terms of power consumption.

[Data Write Operation]

Figure 19:
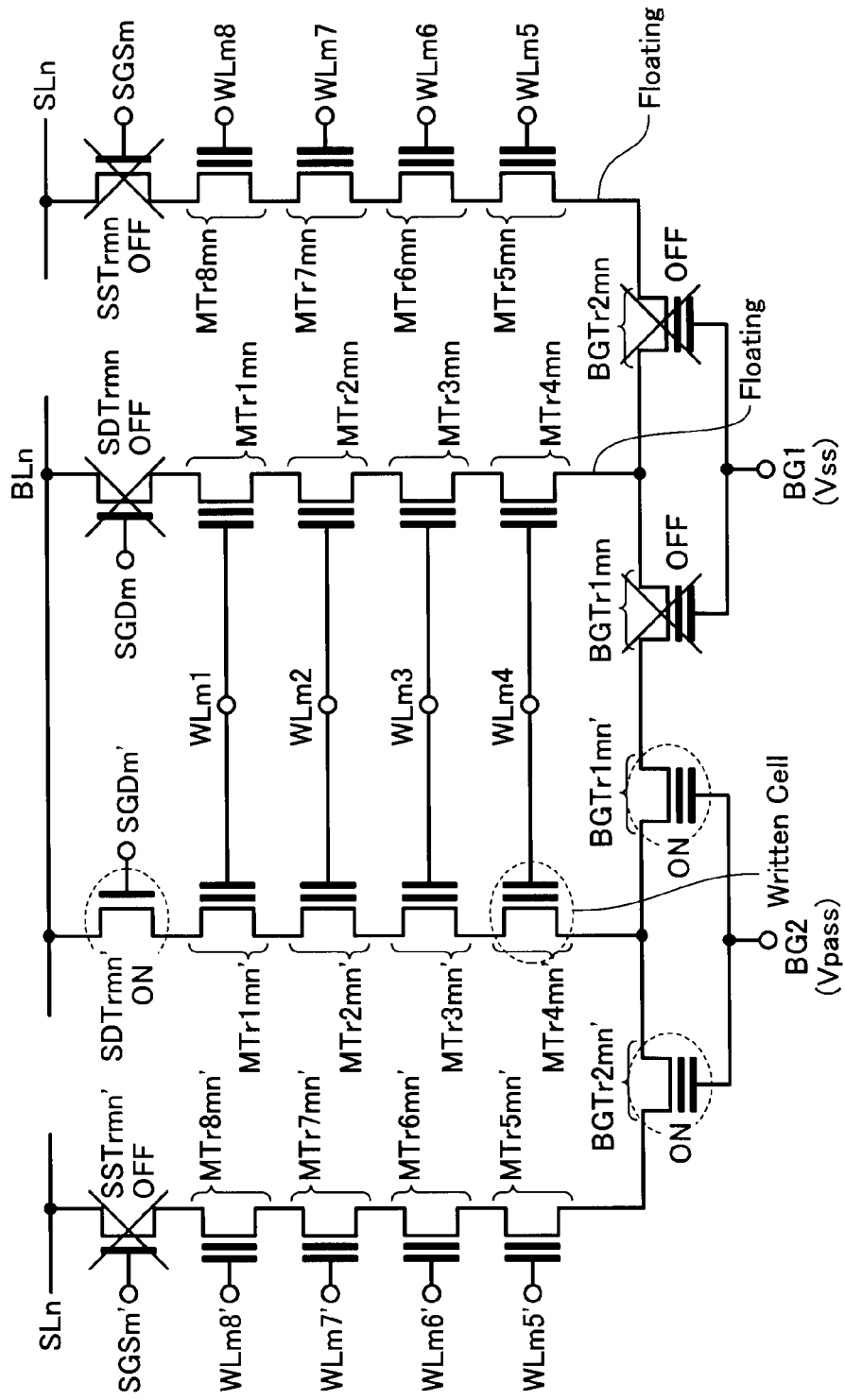
FIG. 19 is a circuit diagram illustrating a data write operation of the non-volatile semiconductor storage device according to the first embodiment (when writing data to one of the memory transistors MTr formed in a columnar portion $CL_{mn}$ connected to a bit line $BL_n$)
Figure 20:
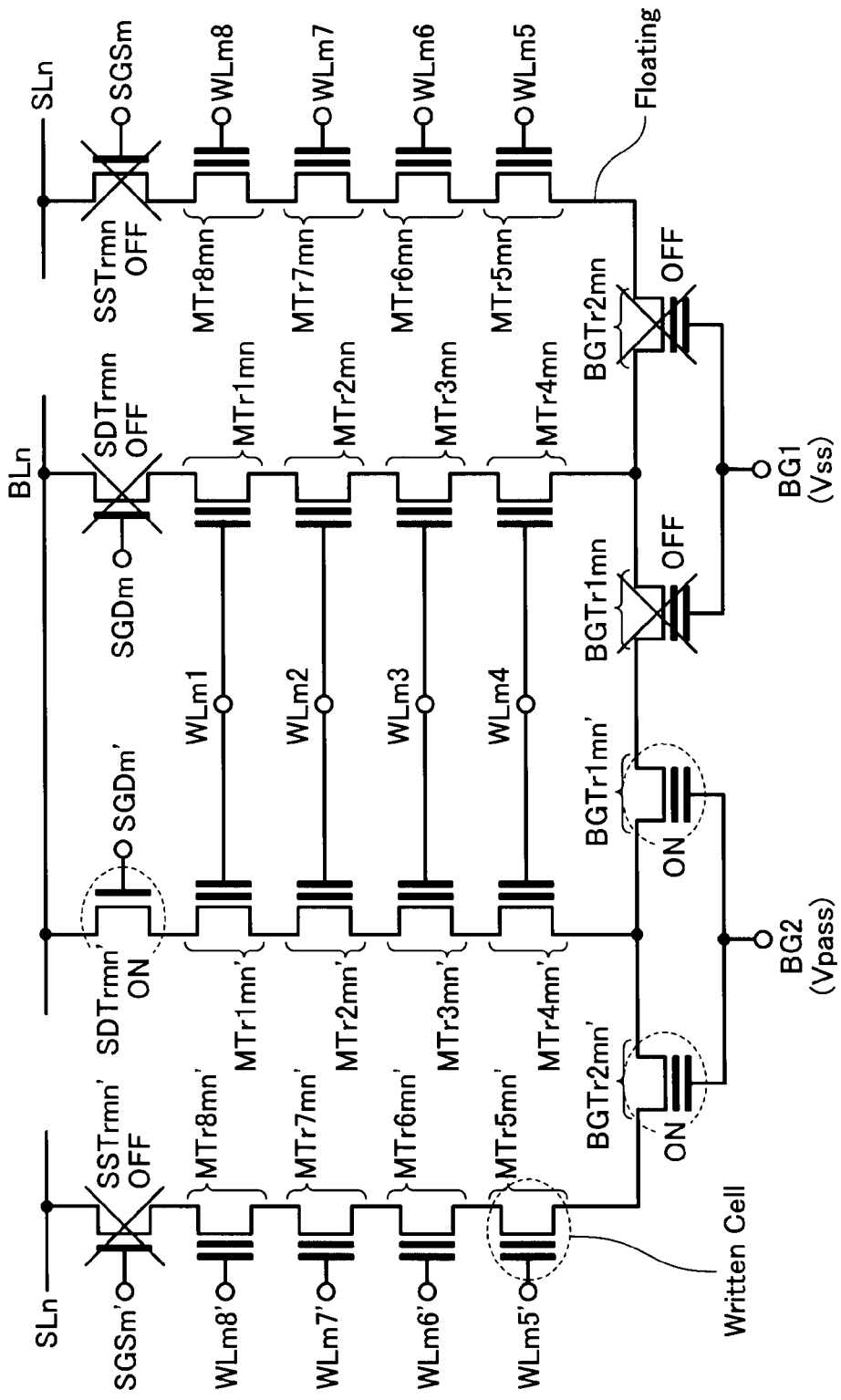
FIG. 20 is a circuit diagram illustrating a data write operation of the non-volatile semiconductor storage device according to the first embodiment (when writing data to one of the memory transistors MTr formed in a columnar portion $CL_{mn}$ connected to a source line $SL_n$)

Referring now to FIGS. 19 and 20, a data write operation of the non-volatile semiconductor storage device according to the first embodiment will be described below. Again, in data write operation, the operation differs depending on the position of the columnar portion $CL_{mn}$ in which the memory transistor for writing is formed, and hence the following description will be made on a case-by-case basis.

[Write Data to a Memory Transistor Formed in a Columnar Portion $CL_{mn}$ Connected to a Bit Line $BL_n$ (Program "1" or "0" (BLSide))]

First, the description is made for one case where the columnar portion $CL_{mn}$, in which the memory transistor for writing is formed, is connected to a bit line $BL_n$. As an example, consider here that data is written to the memory transistor $MTr4_{mn}'$ that is formed in the second columnar portion $CL_{mn}$ from the left in a memory string $MS_{mn}$.

In this case, a different voltage is applied to the bit line $BL_n$ depending on the written data (the ground potential Vss is applied when writing data "0", while the power supply voltage Vdd being applied when writing data "1"). In addition, the drain-side selection transistor $SDTr_{mn}'$, connected in series to the memory transistor $MTr4_{mn}'$, is switched to a conductive state (ON) when the power supply voltage Vdd is applied to the selection gate line SGDm'. As the drain-side selection transistor $SDTr_{mn}'$ is switched to a conductive state, the voltage of the channel region of the selected memory transistor $MTr4_{mn}'$ is set to either the ground potential Vss or the power supply voltage Vdd, depending on the written data. In contrast, the other drain-side selection transistor $SDTr_{mn}$ is maintained in a non-conductive state (OFF) as the selection gate line $SGD_m$ is set at the ground potential Vss.

On the other hand, the source lines $SL_n$ are maintained at the power supply voltage Vdd, and the ground voltage Vss is applied to both the source-side selection gate lines $SGS_m$ and $SGS_m'$. As a result, the source-side selection transistors $SSTr_{mn}$ and $SSTr_{mn}'$ are both maintained in non-conductive states (OFF).

On the other hand, for the back-gate transistors, the back-gate transistors $BGTr1_{mn}'$ and $BGTr2_{mn}'$, located below the memory transistor $MTr4_{mn}$, are switched to conductive states (ON) as a voltage Vpass (on the order of 8V) is applied to the back-gate line BG2. In contrast, the back-gate transistors $BGTr1_{mn}$ and $BGTr2_{mn}$ are maintained in non-conductive states (OFF) as the ground potential Vss is applied to the back-gate line BG1. As such, in writing data, not all of the back-gate transistors BGTr become conductive, and at least one (in this case two, the back-gate transistors $BGTr1_{mn}$ and $BGTr2_{mn}$) of them is maintained in a non-conductive state. This is the difference from the above-mentioned data read operation (FIGS. 17 and 18), where all of the back-gate transistors BGTr are switched to conductive states.

In the word lines $WL_m$, a voltage Vpgm (not less than 20V) for writing data is applied to the word line $WL_m4$ that is connected to the selected memory transistor $MTr4_{mn}$, while a high voltage Vpass (on the order of 8V), as high as not to cause data write, is applied to the word lines $WL_m1$ to 3, $WL_m5$ to 8, and WLm5' to 8'.

Since the transistors are controlled under these conditions, the voltage depending on the written data is applied from the bit line $BL_n$ via the drain-side selection transistor $SDTr_{mn}'$ to only (the left) two columnar portions $CL_{mn}$ in which the memory transistors $MTr1_{mn}'$ to $MTr8_{mn}'$ are formed. On the other hand, (the right) two columnar portions $CL_{mn}$ in which the memory transistors $MTr1_{mn}$ to $MTr8_{mn}$ are formed are maintained in floating states.

[Write Data to a Memory Transistor Formed in a Columnar Portion $CL_{mn}$ Connected to a Source Line $SL_n$ (Program "1" or "0" (SLSide))]

Then, the description is made for another case where the columnar portion $CL_{mn}$, in which the memory transistor for writing is formed, is connected to a source line $SL_n$. As an example, consider here that data is written to the memory transistor $MTr5_{mn}'$ that is formed in the leftmost columnar portion $CL_{mn}$ in a memory string $MS_{mn}$.

In this case, a different voltage is applied to the bit line $BL_n$ depending on the written data (the ground potential Vss is applied when writing data "0", while the power supply voltage Vdd being applied when writing data "1").

In addition, the drain-side selection transistor $SDTr_{mn}'$ is switched to a conductive state (ON) as the power supply voltage Vdd is applied to the selection gate line $SGD_m'$. Additionally, the back-gate transistors $BGTr1_{mn}'$ and $BGTr2_{mn}'$ are switched to conductive states (ON) as the voltage Vpass (on the order of 8V) is applied to the back-gate line BG2. In contrast, the back-gate transistors $BGTr1_{mn}$ and $BGTr2_{mn}$ are maintained in non-conductive states (OFF) as the ground potential Vss is applied to the back-gate line BG1. In this way, as the drain-side selection transistor $SDTr_{mn}'$ and the back-gate transistor $SGTr2_{mn}'$ are switched to conductive states (ON), the voltage of the channel region of the selected memory transistor $MTr5_{mn}'$ is set to either the ground potential Vss or the power supply voltage Vdd, depending on the written data.

The other drain-side selection transistor $SDTr_{mn}$ are switched to non-conductive states (OFF) as the selection gate line $SGD_m$ is set at the ground voltage Vss.

On the other hand, the source lines $SL_n$ are maintained at the power supply voltage Vdd, and the ground voltage Vss is applied to both the source-side selection gate lines $SGS_m$ and $SGSr_m'$. As a result, the source-side selection transistors $SSTr_{mn}$ and $SSTr_{mn}'$ are both maintained in non-conductive states (OFF).

In the word lines $WL_m1$ to 8 and $WL_m5'$ to 8', a voltage Vpgm (not less than 20V) for writing data is applied to the word line $WL_m5'$ that is connected to the selected memory transistor $MTr5_{mn}'$, while a high voltage Vpass (on the order of 8V), as high as not to cause data write, is applied to the word lines $WL_m1$ to 8 and $WL_m6'$ to 8'.

Since the transistors are controlled under these conditions, the voltage (Vss or Vdd) depending on the written data is applied from the bit line $BL_n$ via the drain-side selection transistors $SDTr_{mn}$ and $SDTr_{mn}'$ to only (the left) three columnar portions $CL_{mn}$ in which the memory transistors $MTr1_{mn}$ to $MTr4_{mn}$ and $MTr1_{mn}'$ to $MTr8_{mn}'$ are formed. Data is not written to the memory transistors $MTr1_{mn}$ to $4_{mn}$, $MTr1_{mn}'$ to $MTr4_{mn}'$, and $MTr6_{mn}'$ to $MTr8_{mn}'$, because the voltage Vpass of on the order of 8V is applied to the word lines $WL_m1$ to 4 and $WL_m6'$ to 8'. On the other hand, the rightmost columnar portion $CL_{mn}$ in which the memory transistors $MTr5_{mn}$ to $MTr8_{mn}$ are formed is maintained in a floating state. Thus, data is not also written to the memory transistors $MTr5_{mn}$ to $MTr8_{mn}$.

[Data Erase Operation (Erase)]

Lastly, a brief description will be made on an erase operation of the non-volatile semiconductor storage device according to the first embodiment without illustration.

At first, the operation starts to increase the voltages of a bit line $BL_n$ and source lines $SL_n$. Then, when these voltages are increased to the voltages (on the order of 5V), as necessary to cause a so-called GIDL current (Gate Induced Drain Leak Current), the operation starts to increase the voltages of the selection gate lines $SGD_m$ and $SGS_m$. At this point, the voltages are increased while maintaining a potential difference (on the order of 5V) between the voltages of the bit line $BL_n$ (and the source lines $SL_n$) and the selection gate line $SGD_m$ (and $SGS_m$), as necessary to cause a GIDL current (Gate Induced Drain Leak Current). As a result, a GIDL (Gate Induced Drain Leak) current is produced near the gate end of the selection transistor $SDTr_{mn}$, and the resulting holes are caused to flow into the body part of the memory transistors MTr. The voltages of the bit line $BL_n$ and the source lines $SL_n$ are eventually increased to Vera (20V), and the voltages of the selection gate lines $SGD_m$ and $SGS_m$ to a voltage Verag (e.g., on the order of 15V). Note that the back-gate lines BG1 and BG2 of the back-gate transistors BCTr are set to a floating state. Through the above-mentioned operation, a potential that is near the voltage Vera is transferred to the body part of the memory transistors MTr. Accordingly, when the selected word line $WL_m$ connected to the memory transistor MTr for erasing is set at 0V, electrons are extracted from the electric charge storage layer of the memory transistor MTr. This allows data to be erased from the memory transistor MTr.

On the other hand, those word lines $WL_m$ are set to floating states that are connected to the other memory cells MTr for which the erase operation is not performed. This increases the potential of the body part of the memory transistors MTr, as well as the potentials of the word lines $WL_m$ in floating states due to coupling. In this case, electrons are not extracted (erased) from the electric charge storage layer because no potential difference is generated between the word lines WL and the body part of the memory transistors MTr.

FIG. 21 illustrates a tabular summary of the voltages that are applied to the different components during the above-mentioned operations. In FIG. 21, a mark "Vdd/Vss" indicates that some of multiple wirings of the same type are provided with the power supply voltage Vdd, while the remaining wirings provided with the power supply voltage Vss. In addition, a mark (all) indicates that the same voltage is applied to all wirings of the same type.

Second Embodiment

Figure 22:
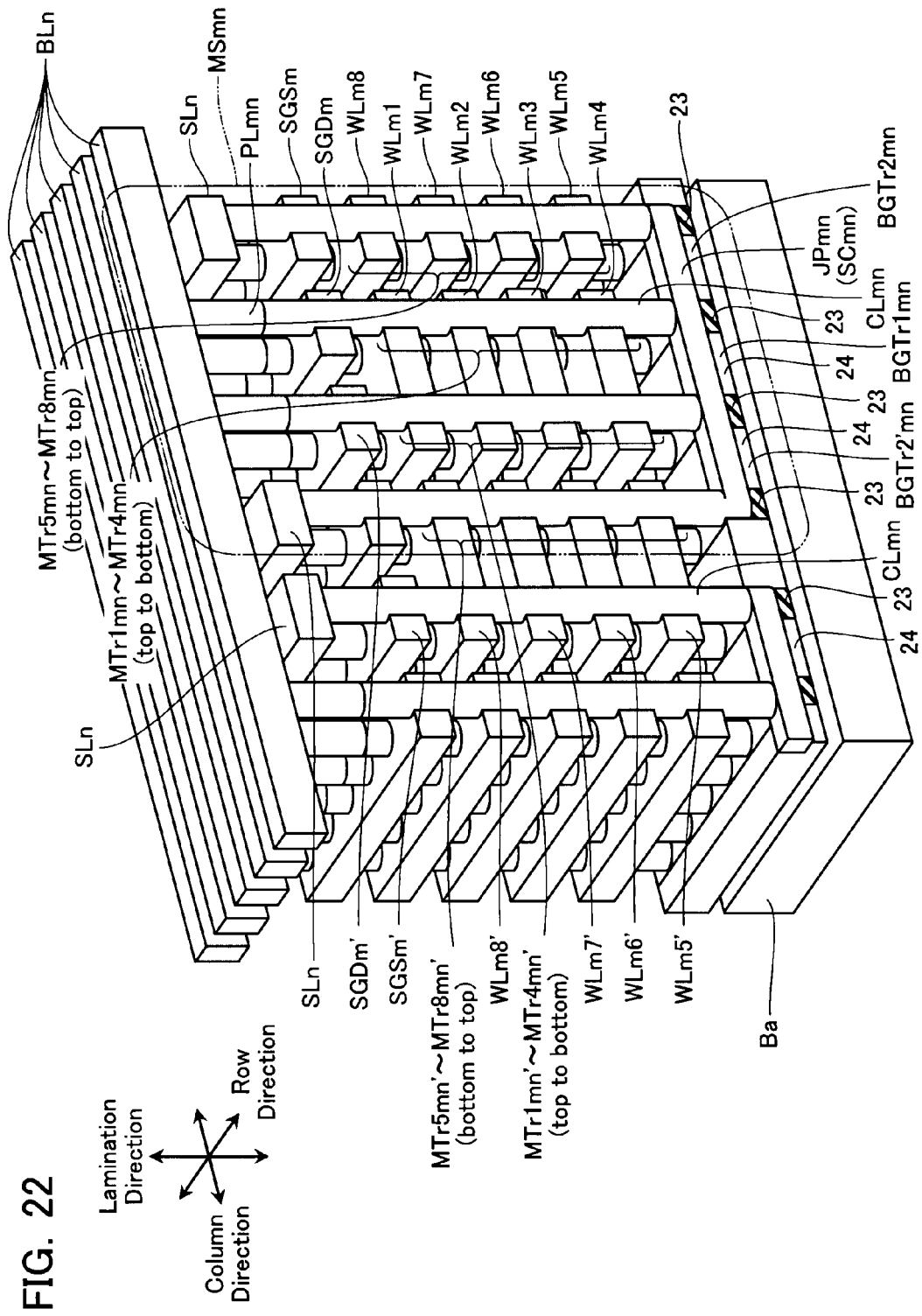
FIG. 22 is a schematic perspective view illustrating a part of a memory transistor area in a non-volatile semiconductor storage device according to a second embodiment of the present invention.
Figure 23:
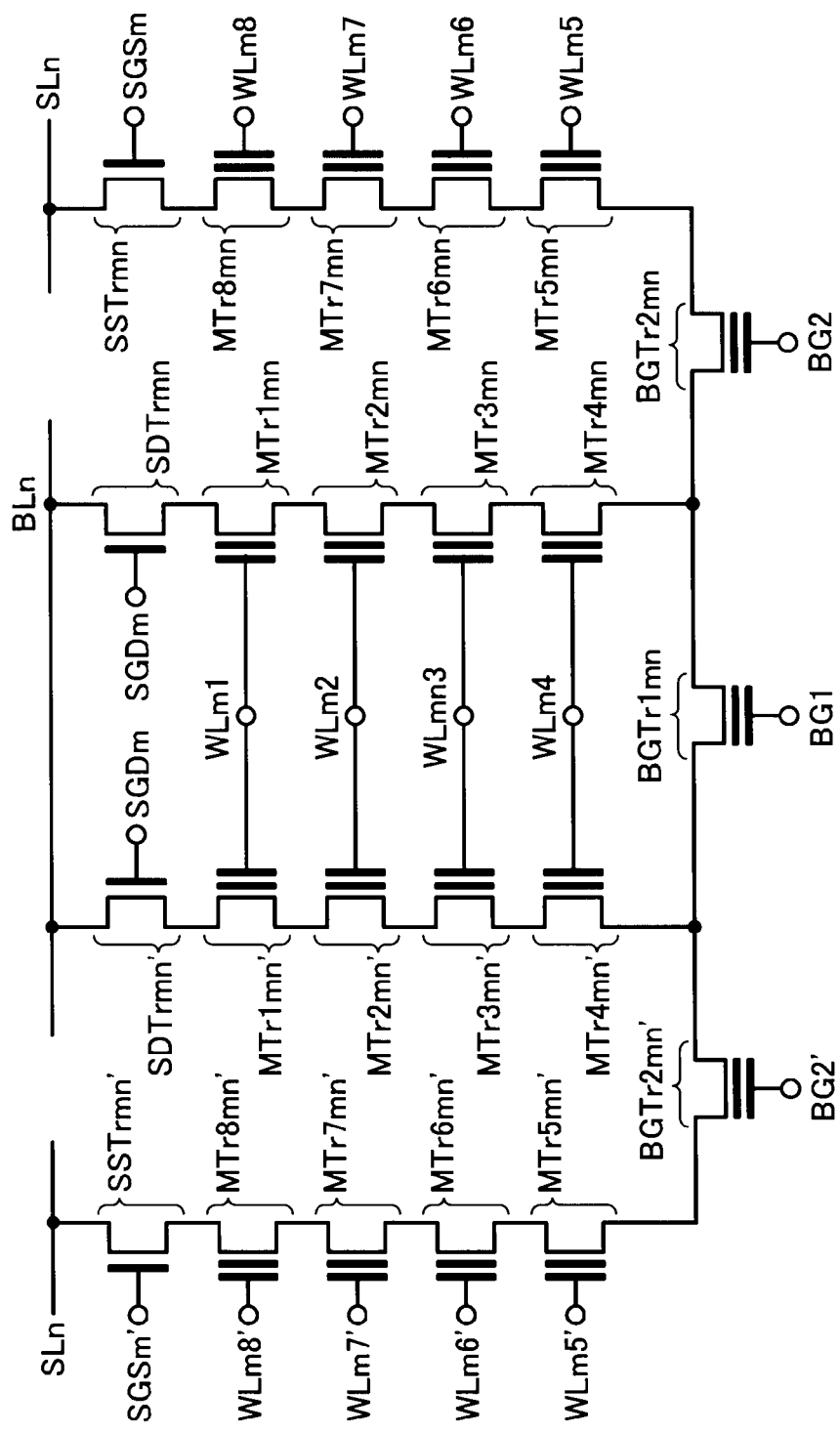
FIG. 23 is an equivalent circuit diagram of one memory string MS according to the second embodiment of the present invention.
Figure 24:
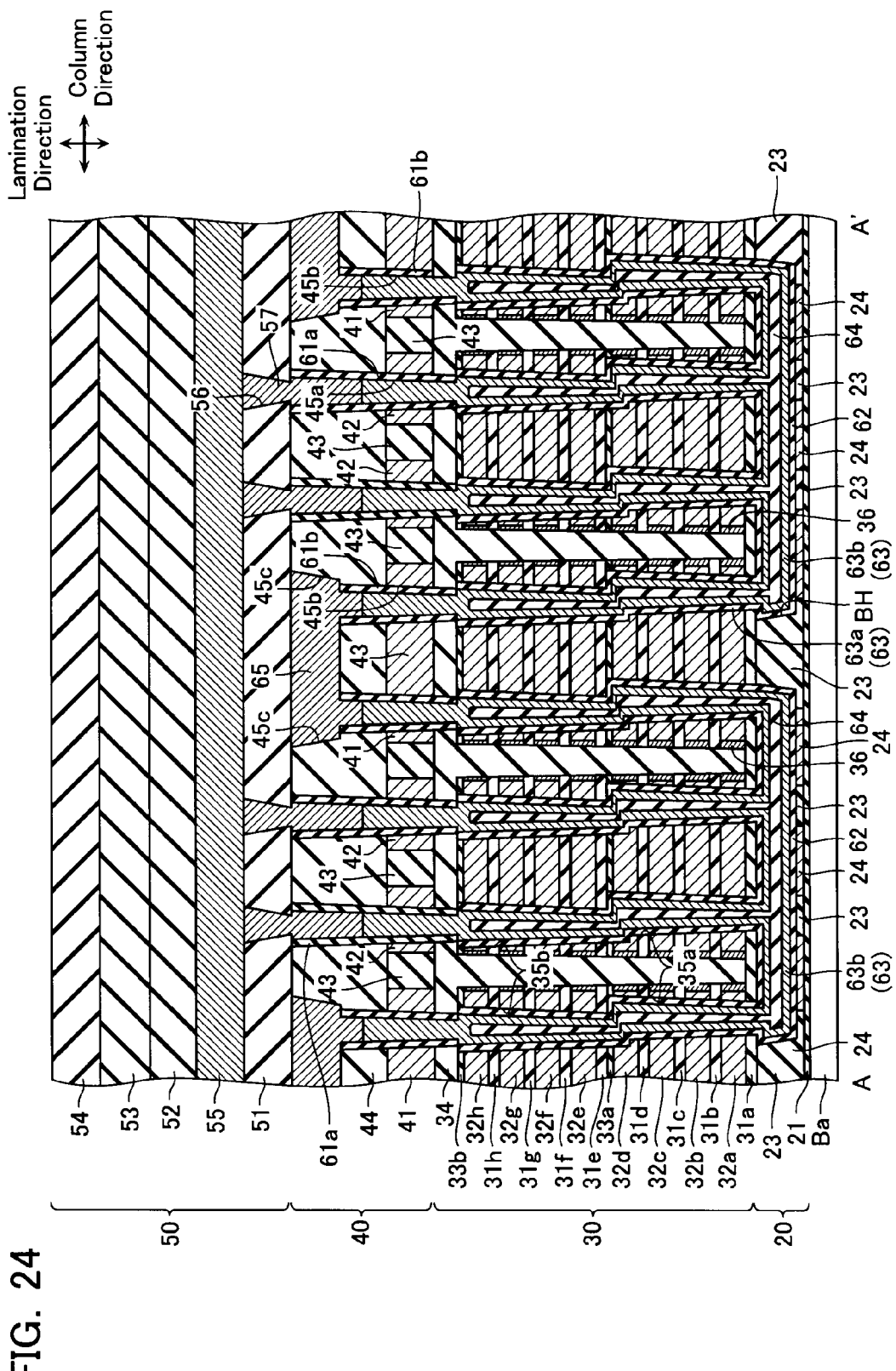
FIG. 24 is a cross-sectional view of the memory transistor area according to the second embodiment of the present invention.

Referring now to FIGS. 22 to 24, a semiconductor storage device according to a second embodiment of the present invention will be described below. FIG. 22 is a schematic perspective view illustrating a part of a memory transistor area 12 in the semiconductor storage device according to the second embodiment. FIG. 23 is an equivalent circuit diagram of one of the memory strings $MS_{mn}$ formed in the memory transistor area 12. FIG. 24 is a cross-sectional view illustrating a specific form of the part of memory transistor area 12. The general configuration is the same as that of the first embodiment (FIG. 1). Note that the same reference numerals represent the same components as the first embodiment in FIGS. 22 to 24, and their detailed description will be omitted as deemed appropriate.

The semiconductor storage device of this embodiment is different from the first embodiment in the configuration of the back-gate transistors. That is, according to this embodiment, three back-gate lines BG1, BG2, BG2' are provided for each memory string $MS_{mn}$, providing three back-gate transistors $BGTr1_{mn}$, $BGTr2_{mn}$, $BGTr2_{mn}'$. The three back-gate transistors $BGTr1_{mn}$, $BGTr2_{mn}$, $BGTr2_{mn}'$ are provided at respective positions between four columnar portions $CL_{mn}$ in one memory string $MS_{mn}$ (in other words, respective positions between the lower ends of two columnar portions $CL_{mn}$) (see FIG. 23). This is the difference from the first embodiment, where two back-gate lines BG1 and BG2 are provided for each memory string $MS_{mn}$, providing four back-gate transistors BGTr.

In the second embodiment, it is required to process columnar portions $CL_{mn}$ in alignment with the gaps between back-gate conductive layers 24, requiring higher processing accuracy than the first embodiment, correspondingly. However, back-gate conductive layers 24 are formed in a respective joining portion between columnar portions $CL_{mn}$, which may ensure more effective control of back-gate transistors than the first embodiment. Among others, improved cut-off characteristics of the back-gate transistor BGTr1$_{mn}$ can be obtained, which may reduce the occurrence of incorrect write operations in writing data due to leakage from the back-gate transistor.

In a specific form, as illustrated in FIGS. 22 and 24, three back-gate conductive layers 24 are arranged at respective positions between four columnar portions CL$_{mn}$ so that they are sandwiched between trench insulation films 23, thereby forming back-gate lines BG1, BG2, and BG2'. With this configuration, the back-gate transistor BGTr1$_{mn}$ may be controlled by the back-gate line BG1, independently of the other back-gate transistors BGTr. The operation of this embodiment is the same as the first embodiment, except the operation of the back-gate transistors BGTr1$_{mn}$, BGTr2$_{mn}$, BGTr2$_{mn}$'. In data read operation, all of the back-gate transistors BGTr1$_{mn}$, BGTr2$_{mn}$, and BGTr2$_{mn}$' are set to conductive states (ON). In data write operation, the back-gate transistor BGTr1$_{mn}$ is only set to a non-conductive state (OFF), while the back-gate transistors BGTr2$_{mn}$ and BGTr2$_{mn}$' are set to conductive states (ON). This embodiment is otherwise the same as the first embodiment.

[Others]

While embodiments of the present invention have been described, the present invention is not intended to be limited to the disclosed embodiments and various other changes, additions or the like may be made thereto without departing from the spirit of the invention. For example, while each memory string MS$_{mn}$ is formed with four columnar portions CL$_{mn}$ connected to one joining portion JP$_{mn}$ in the above-described embodiments, the present invention is not so limited and may merely have an even number of, and not less than 4 (2a, where a is a natural number not less than 2) columnar portions CL$_{mn}$ connected to one joining portion JP$_{mn}$. Thus, a bit line BL$_n$ is connected to one half of the even number of ("2a") columnar portions CL$_{mn}$, i.e., to "a" columnar portions CL$_{mn}$, while source lines SL$_n$ are connected to the remaining "a" columnar portions CL$_{mn}$. In addition, the number of the columnar portions connected to one joining portion may be odd.

The operation to read data is also substantially the same as the above-mentioned embodiments. A different voltage is applied depending on the position of the selected memory transistor MTr (whether it is formed in a columnar portion CL$_{mn}$ connected to a bit line BL$_n$ or in a columnar portion CL$_{mn}$ connected to a source line SL$_n$). That is, if one of the memory transistors MTr formed in the columnar portions CL$_{mn}$ connected to a bit line BL$_n$ is selected to read data therefrom, then the selection transistor SDTr that is formed in the columnar portion CL$_{mn}$ including the selected memory transistor MTr is switched to a conductive state (ON). In addition, the drain-side selection transistor SDTr that is formed in the other columnar portion CL$_{mn}$ connected to the bit line BL$_n$ is maintained in a non-conductive state (OFF). Furthermore, all of the selection transistors SSTr that are formed in a plurality of columnar portions CL$_{mn}$ connected to the source lines SL$_n$ are set to conductive states (ON) (here, it is only required to set more than one, but not all selection transistors SSTr to conductive states). The configuration in this regard is the same as that described in the above embodiments. Other voltages may be set in substantially the same manner as illustrated in FIG. 21 (Read (BLSide)).

Alternatively, if one of the memory transistors MTr formed in the columnar portions CL$_{mn}$ connected to the source lines SL$_n$ is selected to read data therefrom, then the source-side selection transistor SSTr$_{mn}$ that is formed in the columnar portion CL$_{mn}$ including the selected memory transistor MTr is switched to a conductive state (ON). In addition, the other source-side selection transistor SSTr$_{mn}$ that is formed in the other columnar portion CL$_{mn}$ connected to the other source line SL$_n$ is maintained in a non-conductive state (OFF). Furthermore, all of the drain-side selection transistors SDT$_{mn}$ that are formed in a plurality of columnar portions CL$_{mn}$ connected to the bit line BL$_n$ are set to conductive states (ON) (here, it is only required to set more than one, but not all drain-side selection transistors SDT$_{mn}$ to conductive states). The configuration in this regard is the same as that described in the above embodiments. Other voltages may be set in substantially the same manner as illustrated in FIG. 21 (Read (SLSide)).

The voltages applied to the components in data write operation are also substantially the same as those described in the above embodiments. That is, if one of the memory transistors MTr formed in a columnar portion CL$_{mn}$ (first columnar portion) connected to a bit line BL$_n$ is selected to write data thereto, then the drain-side selection transistor SDTr that is formed in the columnar portion CL$_{mn}$ (first columnar portion) including the selected memory transistor MTr is switched to a conductive state. In addition, the source-side selection transistor SSTr that is formed in another columnar portion CL$_{mn}$ (second columnar portion) adjacent to that columnar portion CL$_{mn}$ and connected to a source line SL$_n$ is maintained in a non-conductive state. Then, the conduction states of the back-gate transistors BGTr are controlled so that one columnar portion CL$_{mn}$ (first columnar portion) is electrically connected to another columnar portion CL$_{mn}$ (second columnar portion), and so that the other columnar portions CL$_{mn}$ (in the same memory string MS$_{mn}$) are electrically disconnected from the first columnar portion. Other voltages may be set in substantially the same manner as illustrated in FIG. 21 (Program (BLSide)).

On the other hand, if one of the memory transistors MTr formed in the columnar portions CL$_{mn}$ connected to the source lines SL$_n$ is selected to write data thereto, then one of the drain-side selection transistors SDTr formed in one of the columnar portions CL$_{mn}$ (fourth columnar portion) adjacent to the other columnar portion CL$_{mn}$ (third columnar portion) including the selected memory transistor MTr and is connected to the bit line BL$_n$ is switched to a conductive state. In addition, the source-side selection transistor SSTr formed in the third columnar portion CL$_{mn}$ is maintained in a non-conductive state. Additionally, the conduction states of the back-gate transistors are controlled so that the third columnar portion CL$_{mn}$ is electrically connected to the fourth columnar portion CL$_{mn}$, and so that the other columnar portions CL$_{mn}$ are electrically disconnected from the third columnar portion CL$_{mn}$. Other voltages may be set in substantially the same manner as illustrated in FIG. 21 (Program (BLSide)). The Other voltages may be set in substantially the same manner as illustrated in FIG. 21 (Program (SLSide)).

Figure 25:
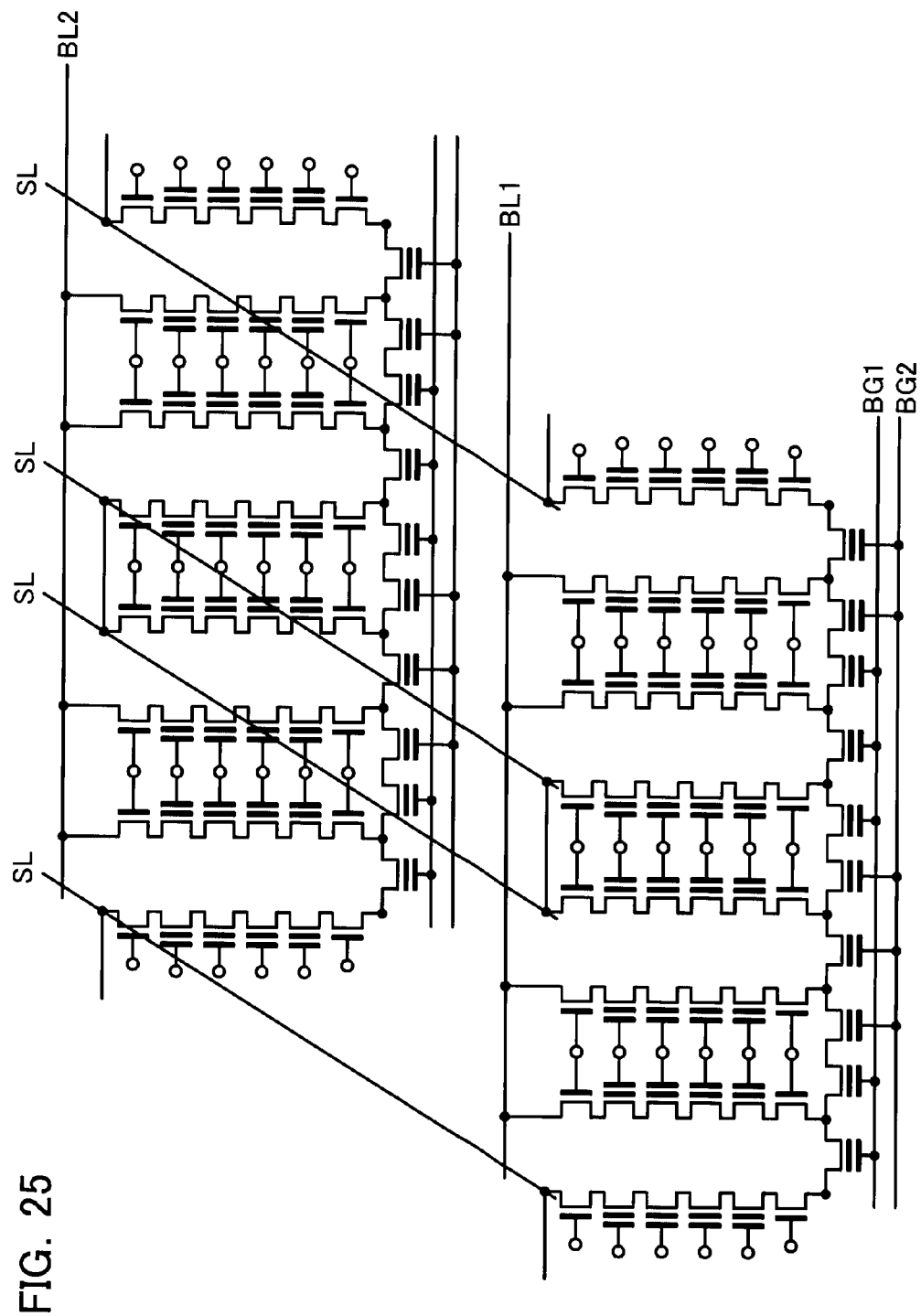
FIG. 25 is an equivalent circuit diagram of one memory cell array according to a variation of the present invention.

It should be noted that the number of columnar portions CL$_{mn}$ included in one memory string MS$_{mn}$ should preferably be a power of two ($2^j$, where j is a natural number), rather than an arbitrary even number, from the viewpoint of address control. FIG. 25 is an equivalent circuit diagram of a semiconductor storage device that comprises memory strings MS, each having eight columnar portions CL$_{mn}$ connected to one joining portion JP$_{mn}$. A bit line BL$_n$ is connected to one half, i.e., four of the eight columnar portions CL$_{mn}$, while source lines SL$_n$ are connected to the remaining four. In this case, the semiconductor storage device takes the form where a source line SL$_n$ is connected to the leftmost columnar portion CL$_{mn}$ in the memory string MS$_{mn}$, followed by two bit lines BL$_n$ and two source lines BL$_n$, alternately. Alternatively, it may take another form where the bit lines $BL_n$ and the source lines $SL_n$ are alternately connected one after the other.

In addition, while the embodiments have been described in the context of one word line $WL_m$ being shared by adjacent two columnar portions $CL_{mn}$, the present invention is not so limited and may be configured to have one word line formed for each columnar portion $CL_{mn}$ (in which case, the wiring pitch of the word lines is half as large as that of the first embodiment).

In addition, in the above-described embodiments, at one end of the a plurality of columnar portions $CL_{mn}$ in one memory string $MS_{mn}$, one source line is positioned on the leftmost columnar portion, followed by two bit lines $BL_n$ and two source lines $SL_n$ on the subsequent columnar portions, alternately (in order of: SL, BL, BL, SL, SL, BL, BL, ... ). However, the present invention is not so limited and may be configured to have the bit lines $BL_n$ and the source lines $SL_n$ alternately arranged one after the other.

What is claimed is:

1. A non-volatile semiconductor storage device comprising:
    a memory cell array including a plurality of memory strings arranged therein, each of the memory strings including a plurality of electrically rewritable memory transistors and selection transistors operative to select the memory transistors; and
    a control unit configured to control voltage supplied to respective control electrodes of the memory transistors and the selection transistors,
    each of the memory strings comprising:
        a body semiconductor layer including four or more columnar portions extending in a vertical direction to a substrate, and a joining portion formed to join the lower ends of the columnar portions;
        an electric charge storage layer formed to surround a side surface of a respective one of the columnar portions;
        a first conductive layer formed to surround a side surface of a respective one of the columnar portions as well as the electric charge storage layer, and functioning as a control electrode of a respective one of the memory transistors; and
        a plurality of second conductive layers formed on a side surface of the joining portion via an insulation film, and functioning as control electrodes of a plurality of back-gate transistors formed at a respective one of the joining portions.

2. The non-volatile semiconductor storage device according to claim 1, wherein
    in reading data from one of the memory transistors,
    the control unit controls conduction states of the selection transistors and the back-gate transistors so that a reading current flows through one of the columnar portions including a selected one of the memory transistors, the joining portion, and through a plurality of the columnar portions other than the columnar portion including the selected memory transistor, in parallel.

3. The non-volatile semiconductor storage device according to claim 2, wherein
    the number of the columnar portions in one of the memory string is an even number, and wherein
    one half of a plurality of the columnar portions connected to a respective one of the joining portions are connected to a bit line, and the remaining half of the columnar portions are connected to a source line.

4. The non-volatile semiconductor storage device according to claim 3, wherein
    when one of the memory transistors formed in the columnar portions connected to the bit line is selected to read data therefrom, the control unit switches one of the selection transistors to a conductive state that is formed in one of the columnar portions including the selected memory transistor, and maintains the other selection transistors in non-conductive states that are formed in the other columnar portions connected to the bit line, while switching a plurality of the selection transistors to conductive states that are formed in a plurality of the columnar portions connected to the source line, whereas
    when one of the memory transistors formed the columnar portions connected to the source line is selected to read data therefrom, the control unit switches one of the selection transistors to a conductive state that is formed in one of the columnar portions including the selected memory transistor, and maintains the other selection transistors in non-conductive states that are formed in the other columnar portions connected to the source line, while switching a plurality of the selection transistors to conductive states that are formed in a plurality of the columnar portions connected to the bit line.

5. The non-volatile semiconductor storage device according to claim 3, wherein
    when one of the memory transistors formed in the columnar portions connected to the bit line is selected to write data thereto, the control unit switches one of the selection transistors to a conductive state that is formed in a first columnar portion including the selected memory transistor, maintains one of the selection transistors in non-conductive states that is formed in a second columnar portion, the second columnar portion being adjacent to the first columnar portion and connected to the source line, and controls conduction states of the back-gate transistors so that the first columnar portion is electrically connected to the second columnar portion, and so that the other columnar portions are electrically disconnected from the first columnar portion, whereas
    when one of the memory transistors formed in the columnar portions connected to the source line is selected to write data thereto, the control unit switches one of the selection transistors to a conductive state that is formed in a fourth columnar portion, the fourth columnar portion being adjacent to a third columnar portion and connected to the bit line, the third columnar portion including the selected memory transistor, maintains one of the selection transistors in non-conductive states that is formed in the third columnar portion, and controls conduction states of the back-gate transistors so that the third columnar portion is electrically connected to the fourth columnar portion, and so that the other columnar portions are electrically disconnected from the third columnar portion.

6. The non-volatile semiconductor storage device according to claim 1, wherein
    the number of the columnar portions in one of the memory string is an even number, and wherein
    one half of a plurality of the columnar portions connected to a respective one of the joining portions are connected to a bit line, and the remaining half of the columnar portions are connected to a source line.

7. The non-volatile semiconductor storage device according to claim 1, wherein
    when one of the memory transistors formed in the columnar portions connected to a bit line is selected to read data therefrom, the control unit switches one of the selection transistors to a conductive state that is formed in one of the columnar portions including the selected memory transistor, and maintains the other selection transistors in non-conductive states that are formed in the other columnar portions connected to the bit line, while switching a plurality of the selection transistors to conductive states that are formed in a plurality of the columnar portions connected to a source line, whereas when one of the memory transistors formed in the columnar portions connected to the source line is selected to read data therefrom, the control unit switches one of the selection transistors to a conductive state that is formed in one of the columnar portions including the selected memory transistor, and maintains the other selection transistors in non-conductive states that are formed in the other columnar portions connected to the source line, while switching a plurality of the selection transistors to conductive states that are formed in a plurality of the columnar portions connected to the bit line.

8. The non-volatile semiconductor storage device according to claim 1, wherein when one of the memory transistors formed in the columnar portions connected to a bit line is selected to write data thereto, the control unit switches one of the selection transistors to a conductive state that is formed in a first columnar portion including the selected memory transistor, maintains one of the selection transistors in non-conductive states that is formed in a second columnar portion, the second columnar portion being adjacent to the first columnar portion and connected to a source line, and controls conduction states of the back-gate transistors so that the first columnar portion is electrically connected to the second columnar portion, and so that the other columnar portions are electrically disconnected from the first columnar portion, whereas when one of the memory transistors formed in the columnar portions connected to the source line is selected to write data thereto, the control unit switches one of the selection transistors to a conductive state that is formed in a fourth columnar portion, the fourth columnar portion being adjacent to a third columnar portion and connected to the bit line, the third columnar portion including the selected memory transistor, maintains one of the selection transistors in non-conductive states that is formed in the third columnar portion, and controls conduction states of the back-gate transistors so that the third columnar portion is electrically connected to the fourth columnar portion, and so that the other columnar portions are electrically disconnected from the third columnar portion.

9. The non-volatile semiconductor storage device according to claim 1, wherein adjacent two of the columnar portions are configured to share the first conductive layer.

10. The non-volatile semiconductor storage device according to claim 9, wherein the number of the columnar portions in one of the memory string is an even number, and wherein one half of a plurality of the columnar portions connected to a respective one of the joining portions are connected to a bit line, and the remaining half of the columnar portions are connected to a source line.

11. The non-volatile semiconductor storage device according to claim 1, wherein the number of the columnar portions connected to a respective one of the joining portions is a power of two.

12. The non-volatile semiconductor storage device according to claim 11, wherein in reading data from one of the memory transistors, the control unit controls conduction states of the selection transistors and the back-gate transistors so that a reading current flows through one of the columnar portions including a selected one of the memory transistors and the joining portion, and through a plurality of the columnar portions other than the columnar portion including the selected memory transistor, in parallel.

13. The non-volatile semiconductor storage device according to claim 11, wherein the number of the columnar portions in one of the memory string is an even number, and wherein one half of a plurality of the columnar portions connected to a respective one of the joining portions are connected to a bit line, and the remaining half of the columnar portions are connected to a source line.

14. The non-volatile semiconductor storage device according to claim 11, wherein when one of the memory transistors formed in the columnar portions connected to the bit line is selected to read data therefrom, the control unit switches one of the selection transistors to a conductive state that is formed in one of the columnar portions including the selected memory transistor, and maintains the other selection transistors in non-conductive states that are formed in the other columnar portions connected to the bit line, while switching a plurality of the selection transistors to conductive states that are formed in a plurality of the columnar portions connected to the source line, whereas when one of the memory transistors formed in the columnar portions connected to the source line is selected to read data therefrom, the control unit switches one of the selection transistors to a conductive state that is formed in one of the columnar portions including the selected memory transistor, and maintains the other selection transistors in non-conductive states that are formed in the other columnar portions connected to the source line, while switching a plurality of the selection transistors to conductive states that are formed in a plurality of the columnar portions connected to the bit line.

15. The non-volatile semiconductor storage device according to claim 1, wherein the number of the columnar portions connected to a respective one of the joining portions is four.

16. The non-volatile semiconductor storage device according to claim 15, wherein among the four columnar portions, first and fourth columnar portions connected to respective ends of the joining portion are connected to a source line, and second and third columnar portions are connected to a bit line.

17. The non-volatile semiconductor storage device according to claim 16, wherein first and second back-gate transistors are formed at respective positions of the joining portion between the second and third columnar portions, the first back-gate transistor being switched to a conductive state by a first signal, and the second back-gate transistor being switched to a conductive state by a second signal, and third and fourth back-gate transistors are formed at respective positions of the joining portion between the first and second columnar portions and between the third and fourth columnar portions, respectively, the third back-gate transistor being switched to a conductive state by the first signal, and the fourth back-gate transistor being switched to a conductive state by the second signal.

18. The non-volatile semiconductor storage device according to claim 17, wherein the second and third columnar portions are configured to share the first conductive layer.

* * * * *